(12) United States Patent
Fukuda et al.

(10) Patent No.: US 9,332,631 B2
(45) Date of Patent: May 3, 2016

(54) HEAT DISSIPATING SUBSTRATE, AND ELEMENT EQUIPPED WITH SAME

(71) Applicant: DAI NIPPON PRINTING CO., LTD., Tokyo-to (JP)

(72) Inventors: Shunji Fukuda, Tokyo-to (JP); Katsuya Sakayori, Tokyo-to (JP); Toshimasa Takarabe, Tokyo-to (JP)

(73) Assignee: DAI NIPPON PRINTING CO., LTD., Tokyo-to (JP)

(*) Notice: Subject to any disclaimer, the term of this patent is extended or adjusted under 35 U.S.C. 154(b) by 306 days.

(21) Appl. No.: 14/032,302

(22) Filed: Sep. 20, 2013

(65) Prior Publication Data

US 2014/0085830 A1 Mar. 27, 2014

Related U.S. Application Data

(63) Continuation of application No. PCT/JP2012/057857, filed on Mar. 23, 2012.

(30) Foreign Application Priority Data

Mar. 23, 2011 (JP) ................................. 2011-064537
Oct. 6, 2011 (JP) ................................. 2011-222364
Mar. 22, 2012 (JP) ................................. 2012-066158

(51) Int. Cl.
*H05K 1/02* (2006.01)
*H01L 51/52* (2006.01)
(Continued)

(52) U.S. Cl.
CPC .......... *H05K 1/0271* (2013.01); *C08G 73/1042* (2013.01); *H01L 51/529* (2013.01); *H01L 51/5218* (2013.01); *H01L 23/3735* (2013.01); *H01L 2251/5315* (2013.01); *H01L 2924/0002* (2013.01)

(58) Field of Classification Search
CPC ..................................................... H05K 1/0271
See application file for complete search history.

(56) References Cited

U.S. PATENT DOCUMENTS 5,990,553 A * 11/1999 Morita .................... H01L 23/13
257/699
7,384,683 B2 * 6/2008 Echigo ................... H05K 1/036
156/305
7,678,315 B2 * 3/2010 Yanagida ................ B32B 27/18
264/171.1

(Continued)

FOREIGN PATENT DOCUMENTS

CN 101509651 A 8/2009
JP 09-099518 A 4/1997

(Continued)

OTHER PUBLICATIONS

International Search Report mailed Jun. 12, 2012; PCT/JP2012/057587.

*Primary Examiner* — Robert J Hoffberg
(74) *Attorney, Agent, or Firm* — Ladas & Parry LLP

(57) ABSTRACT

A main object of the invention is to provide a heat dissipating substrate which is excellent in heat dissipating performance, and undergoes neither peel therein nor short circuit. The invention attains this objet by providing a heat dissipating substrate comprising a support base material, an insulating layer formed directly on the support base material, and a wiring layer formed directly on the insulating layer, wherein the insulating layer is formed by non-thermoplastic polyimide resin, and has a thickness in the range of 1 μm to 20 μm.

9 Claims, 2 Drawing Sheets

(51) Int. Cl.
*C08G 73/10* (2006.01)
*H01L 23/373* (2006.01)

(56) References Cited

U.S. PATENT DOCUMENTS

| | | | | |
|---|---|---|---|---|
| 8,097,814 | B2* | 1/2012 | Ishimaru | H01L 23/3735 |
| | | | | 174/250 |
| 8,158,268 | B2* | 4/2012 | Kaneshiro | B32B 15/08 |
| | | | | 428/458 |
| 8,313,831 | B2* | 11/2012 | Tanaka | B32B 7/10 |
| | | | | 174/259 |
| 2006/0115670 | A1* | 6/2006 | Tanaka | B32B 7/10 |
| | | | | 428/615 |
| 2007/0089900 | A1* | 4/2007 | Mitamura | H05K 1/028 |
| | | | | 174/254 |
| 2009/0142607 | A1* | 6/2009 | Narui | B29C 47/0021 |
| | | | | 428/458 |
| 2009/0195997 | A1 | 8/2009 | Ishimaru et al. | |

FOREIGN PATENT DOCUMENTS

| | | |
|---|---|---|
| JP | 2003-071982 A | 3/2003 |
| JP | 2003-340961 A | 12/2003 |
| JP | 2004-230670 A | 8/2004 |
| JP | 2006-228878 A | 8/2006 |
| JP | 2009-049302 A | 3/2009 |
| JP | 2009-182227 A | 8/2009 |
| JP | 2010-125793 A | 6/2010 |
| JP | 2011235583 A * | 11/2011 |

* cited by examiner

HEAT DISSIPATING SUBSTRATE, AND ELEMENT EQUIPPED WITH SAME

TECHNICAL FIELD

The present invention relates to a heat dissipating substrate which is excellent in heat dissipating performance, and undergoes neither peel therein nor short circuit.

BACKGROUND ART

In recent years, as electronic elements, many elements generating a large quantity of heat when used have come to be used, examples thereof including light emitting didoes (also abbreviated to LEDs hereinafter), organic electroluminescence (also abbreviated to organic EL hereinafter) elements, and power semiconductors. Such elements, which are large in generated-heat-quantity, have problems that generated heat deteriorates the element themselves, and deteriorates members in the vicinity of the elements. Thus, it is general to use a substrate excellent in heat dissipating performance as a substrate on which electronic elements as described above are arranged.

As such a substrate, which has heat dissipating performance, known is a heat dissipating substrate having a support base material, an insulating layer containing an insulating resin bonded onto the support base material, and a wiring layer formed on the insulating layer and connected electrically to electronic elements arranged on this wiring layer, that is, a heat dissipating substrate.

Although epoxy resin or thermoplastic polyimide resin used as the insulating resin has an advantage of being easily bonded onto the support base material, the resin has problems of being insufficient in insulating performance, heat resistance and others so as not to be easily made into a thin film, of being difficult to reduce short circuits in a heat dissipating substrate, and of making difficult the heat dissipating substrate be excellent in heat dissipating performance.

The resin also tends to be higher in coefficient of linear thermal expansion than the support base material to have a problem that the resin is warped, peeled from the support base material, or is subjected to other damages.

In order to solve such problems, for example, Patent Literatures 1 to 3 (Japanese Patent Application Publication (JP-A) No. 2003-071982, JP-A No. H09-099518, and JP-A No. 2004-230670) each discloses, as an insulating layer as described above, a layer having a basic insulating layer and adhesive layers made of thermoplastic polyimide resin and formed on both surfaces of the basic insulating layer, respectively.

According to such inventions, the use of the basic insulating layer made of material high in insulating performance makes it possible to prevent the generation of short circuit stably.

However, it is difficult to make the support base material, the basic insulating layer, and the adhesive layers made of thermoplastic polyimide resin equivalent to one another in coefficient of linear thermal expansion. Thus, there is caused a problem that the substrate cannot be sufficiently restrained from being warped, nor undergoing peel therein or other damages when heated. There also arises a problem that the substrate includes the adhesive layers made of thermoplastic polyimide resin so that the insulating layer becomes large in thickness not to exhibit a sufficient heat dissipating performance.

SUMMARY OF INVENTION

Technical Problem

A main object of the present invention is to provide a heat dissipating substrate which is excellent in heat dissipating performance, and undergoes neither peel therein nor short circuit.

Solution to Problem

In order to solve the above-mentioned problems, the present invention provides a heat dissipating substrate, comprising: a support base material, an insulating layer formed directly on the support base material, and a wiring layer formed directly on the insulating layer, wherein the insulating layer is formed by a non-thermoplastic polyimide resin, and has a thickness in the range of 1 µm to 20 µm.

According to the invention, the insulating layer is formed directly on a support base material, is formed by a non-thermoplastic polyimide resin, and has a thickness in the range of 1 µm to 20 µm, thereby rendering the heat dissipating substrate of the invention a substrate which is excellent in heat dissipating performance, and undergoes neither peel therein nor short circuit.

In the invention, it is preferred that the insulating layer is substantially a single layer. Since the insulating layer is substantially a single layer, the insulating layer having the above-mentioned thickness can easily be formed.

In the invention, it is preferred that the support base material has a thickness of 70 µm or more. This embodiment makes it possible to make the heat dissipating performance higher.

In the invention, it is preferred that the insulating layer has a coefficient of linear thermal expansion in the range of 0 ppm/° C. to 40 ppm/° C. If the coefficient of linear thermal expansion is too large, the insulating layer is largely stretched or shrunken when changed in temperature to produce a bad effect onto the present heat dissipating substrate about dimensional stability.

In the invention, it is preferred that the difference in coefficient of linear thermal expansion between a coefficient of linear thermal expansion of the insulating layer and a coefficient of linear thermal expansion of the support base material is 15 ppm/° C. or less. As the coefficient of linear thermal expansion of the insulating layer is closer to that of the support base material, the heat dissipating substrate is further restrained from being warped and further becomes smaller in stress in the interface between the insulating layer and the support base material when changed in thermal environment around the heat dissipating substrate, thereby being improved in adhesive property between the two.

In the invention, it is preferred that the insulating layer has a coefficient of hygroscopic expansion in the range of 0 ppm/% RH to 15 ppm/% RH. The coefficient of hygroscopic expansion in the range makes it possible to make the water absorption of the insulating layer sufficiently small. Thus, the heat dissipating substrate of the invention can easily be stored. When the heat dissipating substrate is used to produce an element, a process therefor becomes simple and easy.

In the invention, it is preferred that the non-thermoplastic polyimide resin has a volume resistivity of $1.0 \times 10^{12}$ Ω·m or more. The volume resistivity in this range makes it possible to make the insulating layer thin so that the heat dissipating substrate of the invention can be improved in heat dissipating performance.

In the invention, it is preferred that: the support base material is a base material comprising a metal base material containing aluminum or an alloy made mainly of aluminum, and a support base material-protective layer formed on the metal base material; and the insulating layer is patterned. The support base material has the support base material-protective layer, thereby making it possible to stabilize this support base material even when this support base material has the metal base material and the patterned insulating layer.

In the invention, it is preferred that the support base material, the insulating layer, and the wiring layer are each independently patterned. This embodiment makes it easy to render the heat dissipating substrate of the invention a substrate excellent in heat dissipating performance, productivity and others.

The invention also provides an element, comprising: the above-mentioned heat dissipating substrate, and an electronic element arranged on the wiring layer of the heat dissipating substrate.

According to the invention, the element is excellent in heat dissipating performance since the above-mentioned heat dissipating substrate is used therein. Thus, this element can be rendered an element that can decrease a deterioration in the electronic element or members in the vicinity thereof, and can also be rendered an element that undergoes neither peel therein nor short circuit.

Advantageous Effects of Invention

The invention produces advantageous effects that a heat dissipating substrate can be provided which is excellent in heat dissipating performance and undergoes neither peel therein nor short circuit.

DESCRIPTION OF EMBODIMENTS

The invention relates to a heat dissipating substrate, and an element using the substrate.

Hereinafter, the heat dissipating substrate and the element of the invention will be described.

A. Heat Dissipating Substrate

The heat dissipating substrate of the invention is first described.

The heat dissipating substrate of the invention comprises a support base material, an insulating layer formed directly on the support base material, and a wiring layer formed directly on the insulating layer, wherein the insulating layer is formed by a non-thermoplastic polyimide resin, and has a thickness in the range of 1 μm to 20 μm.

Figure 1:
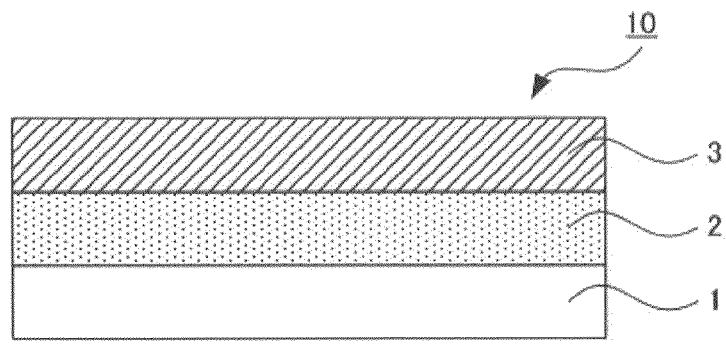
FIG. 1 is a schematic sectional view illustrating an example of the heat dissipating substrate of the invention.

Referring to the drawings, the heat dissipating substrate of the invention is described. FIG. 1 is a schematic sectional view illustrating an example of the heat dissipating substrate of the invention. As illustrated in FIG. 1, a heat dissipating substrate 10 of the invention comprises a support base material 1, an insulating layer 2 formed directly on the support base material 1, and a wiring layer 3 formed on the insulating layer 2.

In this example, the insulating layer 2 has a thickness in the range of 1 μm to 20 μm, and is a single layer made only of a non-thermoplastic polyimide resin.

According to the invention, the insulating layer is formed directly on the support base material, and the wiring layer, which is in contact with electronic elements, is formed directly on the insulating layer, so that heat from the wiring layer can be effectively conducted to the support base material. Moreover, the thickness of the insulating layer is as small as a value in the range of 1 μm to 20 μm, thereby making the heat dissipating substrate excellent in heat dissipating performance.

The insulating layer is made of the non-thermoplastic polyimide resin, that is, this insulating layer contains no thermoplastic polyimide resin or the like, thereby making it easy to make the insulating layer close in coefficient of thermal expansion to any member made of a material excellent in thermal conductivity, such as a metal used ordinarily for a support base material or a wiring layer. Consequently, the heat dissipating substrate can be caused to undergo neither warp, peel therein, nor other damages.

The non-thermoplastic polyimide resin has a property of being particularly more excellent in insulating performance than an epoxy resin, a thermoplastic resin or the like. Thus, even when the thickness of the insulating layer is made small, the substrate can exhibit a sufficient insulating performance to be easily caused not to undergo short circuit.

When the heat dissipating substrate has the insulating layer in this way, the substrate can be made excellent in heat dissipating performance and caused to undergo neither peel therein nor short circuit.

The heat dissipating substrate of the invention has at least the support base material, the insulating layer, and the wiring layer.

Hereinafter, a description will be made about each of the constituents of the heat dissipating substrate of the invention.

1. Insulating Layer

The insulating layer used in the invention is a member formed directly on a support base material as described above, and is made of a non-thermoplastic polyimide resin and has a thickness in the range of 1 μm to 20 μm.

The wording "formed directly on a support base material" herein denotes that any adhesive layer made of thermoplastic polyimide resin or any other is not included therebetween to denote that the insulating layer is formed to contact with the support base material directly. Incidentally, when the support base material is a base to which a surface treatment is applied, the wording denotes that the insulating layer is formed to contact directly on a layer based on this applied surface treatment.

(1) Non-Thermoplastic Polyimide Resin

The non-thermoplastic polyimide resin used in the invention is a resin having no thermoplasticity, that is, a resin showing no plasticity at temperatures at which ordinary thermoplastic polyimides exhibit thermoplasticity. Specifically, the resin is a polyimide resin constantly having a storage elastic modulus of $1.0 \times 10^8$ Pa or more in a temperature range from room temperature (about 25° C.) to a lower temperature out of 300° C., and "the glass transition temperature thereof +20° C.". A method for calculating out the glass transition temperature will be described below.

The storage elastic modulus in the temperature range from room temperature (about 25° C.) to a lower temperature out of "300° C.", and "the glass transition temperature thereof +20°

C." is not particularly limited as far as the storage elastic modulus is constantly $1.0×10^8$ Pa or more. The storage elastic modulus is preferably in the range of $1.0×10^8$ to $1.0×10^{11}$ Pa, and more preferably $5.0×10^8$ to $5.0×10^{10}$ Pa. If the storage elastic modulus is lower than this range, the insulating layer may start to soften in a high-temperature process such as solder reflow, so that the workpiece of the heat dissipating substrate may be deteriorated in dimensional stability when heated. Moreover, the following problem may be caused, details of the problem being to be described later, when a polyimide has thermoplasticity, it is necessary to use a monomer (mainly a diamine) having a flexible skeleton so that the resultant film is lowered in glass transition temperature and is further increased in coefficient of linear thermal expansion to make it difficult to make this increased coefficient equivalent to the coefficient of any metal layer. Contrarily, when the storage elastic modulus is higher than the above-mentioned range, the film is not easily softened into such a level that the film relieves thermal stress therein when baked. Thus, a bad effect may be produced onto the strain or surface flatness of the insulating layer. Moreover, the following problem may be caused, details of the problem being to be described later, when a polyimide is high in storage elastic modulus, it is necessary to use a monomer (mainly a diamine) having a rigid skeleton so that the resultant film is heightened in glass transition temperature and is further excessively decreased in coefficient of linear thermal expansion to make it difficult to make this decreased coefficient equivalent to the coefficient of any metal layer.

Incidentally, the storage elastic modulus is a value obtained by making a measurement with a dynamic viscoelasticity measuring instrument (for example, RSA3™ (manufactured by TA Instruments Japan Inc.)) under conditions that the frequency is 1 Hz and the temperature-raising rate is 5° C./minute.

Thermoplastic polyimide resin in the present application usually denotes a polyimide having a storage elastic modulus less than $1.0×10^8$ in the temperature range from room temperature (about 25° C.) to a lower temperature out of "300° C." and "the glass transition temperature thereof +20° C.".

In the invention, the glass transition temperature (Tg) of the non-thermoplastic polyimide resin is not particularly limited as far as this temperature permits the resin to exhibit a desired insulating performance and other properties. The glass transition temperature is preferably 250° C. or higher, and is in particular desirably 270° C. or higher from the viewpoint of heat resistance. When the Tg is within this range, the heat dissipating substrate of the invention can be made sufficiently high in heat resistance.

Incidentally, as the Tg is higher, the heat resistance is favorably higher. Usually, it is preferred to subject the polyimide to curing (heat treatment at a temperature higher than Tg) in order to cause the polyimide to exhibit its physical properties; thus, when the Tg is too high, the insulating layer, the support base material and others may be deteriorated at the time of the curing. From such a viewpoint, the upper limit of the Tg is preferably 500° C. If the Tg is lower than the above-mentioned range, the temperature at which the insulating layer starts to soften becomes about 250° C. or lower so that the insulating layer may start to soften in a high-temperature process such as solder reflow. Thus, the workpiece of the heat dissipating substrate may be deteriorated in dimensional stability when heated. Contrarily, if the Tg is higher than the range, the softening-starting temperature is high so that the insulating layer cannot sufficiently relieve thermal stress therein, or the insulating layer, the support base material or some other may be deteriorated.

In the invention, preferably, the non-thermoplastic polyimide resin does not have a melting point of 250° C. or lower. More preferably, the resin does not have a melting point of 270° C. or lower. Even more preferably, the resin does not have a melting point of 300° C. or lower. Such cases make it possible to make the heat dissipating substrate of the invention sufficiently high in heat resistance.

The volume resistivity of the non-thermoplastic polyimide resin used in the invention is not particularly limited as far as the resistivity makes it possible to prevent a short circuit between the support base material and the wiring layer. Specifically, the volume resistivity of the non-thermoplastic polyimide resin is preferably $1.0×10^{12}$ Ω·m or more, more preferably $1.0×10^{13}$ Ω·m or more, and even more preferably $1.0×10^{14}$ Ω·m or more. When the volume resistance is high, the insulating layer can be made thin to improve the heat dissipating substrate of the invention in heat dissipating performance.

Incidentally, the volume resistivity can be measured by a method in accordance with a standard such as JIS K6911, JIS C2318 or ASTM D257.

The thermal conductivity of the non-thermoplastic polyimide resin used in the invention is not particularly limited as far as the thermal conductivity can give a desired thermoconductivity to the heat dissipating substrate. The thermal conductivity can be made equivalent to that of ordinary polyimide resins.

The polyimide resin used in the invention is a material containing, as a main component, a polyimide resin.

The wording "containing, as a main component" denotes that the non-thermoplastic polyimide resin contains a polyimide resin to such a degree that the non-thermoplastic polyimide resin satisfies the above-mentioned properties. Specifically, the wording denotes a case where the polyimide resin content by percentage in the non-thermoplastic polyimide resin is 75% or more by mass, preferably 90% by mass, and particularly 100% by mass. Preferably, the non-thermoplastic polyimide resin consists only of the polyimide resin, in other words, the insulating layer consists only of the polyimide resin. In this case, primary properties of the polyimide resin, such as the heat resistance and the insulating performance thereof, become good.

The polyimide resin can be controlled about the insulating performance, the thermoconductivity, the coefficient of hygroscopic expansion, the coefficient of linear thermal expansion, and the storage elastic modulus thereof by selecting, for example, the structure of the polyimide resin appropriately.

The polyimide resin used in the invention is preferably a polyimide resin having an aromatic skeleton in order to make the coefficient of linear thermal expansion, the coefficient of hygroscopic expansion, the thermoconductivity, and the storage elastic modulus of the insulating layer suitable for the heat dissipating substrate of the invention. Out of species of the polyimide resin, any polyimide resin having an aromatic skeleton is excellent in heat resistance, and insulating performance when used in the form of a thin film, is high in thermal conductivity, and is low in coefficient of linear thermal expansion since these advantages originate from the skeleton, which is rigid and high in planarity. Thus, this polyimide is preferably used in the insulating layer of the heat dissipating substrate of the invention.

A specific example thereof is a resin represented by the following formula (I):

[Chemical Formula 1]

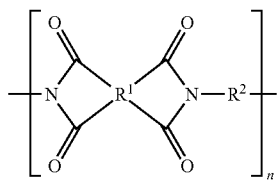

in which $R^1$(s) is/are (each) a tetravalent organic group, $R^2$(s) is/are (each) a bivalent organic group, repeated $R^1$s, as well as repeated $R^2$s, may be the same or different, and "n" is a natural number of 1 or more.

In the formula (I), $R^1$ (s) is/are (each) generally a structure originating from a tetracarboxylic dianhydride. $R^2$(s) is/are (each) generally a structure originating from a diamine. The polyimide resin is generally obtained by causing a tetracarboxylic dianhydride and a diamine to react with each other to synthesize a polyimide precursor such as polyamic acid, and then imidizing the precursor thermally or chemically.

Examples of the tetracarboxylic dianhydride usable for the polyimide resin include ethylenetetracarboxylic dianhydride, butanetetracarboxylic dianhydride, cyclobutanetetracarboxylic dianhydride, cyclopentanetetracarboxylic dianhydride, pyromellitic dianhydride, 3,3',4,4'-benzophenonetetracarboxylic dianhydride, 2,2',3,3'-benzophenonetetracarboxylic dianhydride, 3,3',4,4'-biphenyltetracarboxylic dianhydride, 2,2',3,3'-biphenyltetracarboxylic dianhydride, 2,2',6,6'-biphenyltetracarboxylic dianhydride, 2,2-bis(3,4-dicarboxyphenyl)propane dianhydride, 2,2-bis(2,3-dicarboxyphenyl)propane dianhydride, bis(3,4-dicarboxyphenyl)ether dianhydride, bis(3,4-dicarboxyphenyl)sulfone dianhydride, 1,1-bis(2,3-dicarboxyphenyl)ethane dianhydride, bis(2,3-dicarboxyphenyl)methane dianhydride, bis(3,4-dicarboxyphenyl)methane dianhydride, 2,2-bis(3,4-dicarboxyphenyl)-1,1,1,3,3,3-hexafluoropropane dianhydride, 2,2-bis(2,3-dicarboxyphenyl)-1,1,1,3,3,3-hexafluoropropane dianhydride, 1,3-bis[(3,4-dicarboxy)benzoyl]benzene dianhydride, 1,4-bis[(3,4-dicarboxy)benzoyl]benzene dianhydride, 2,2-bis{4-[4-(1,2-dicarboxy)phenoxy]phenyl}propane dianhydride, 2,2-bis{4-[3-(1,2-dicarboxy)phenoxy]phenyl}propane dianhydride, bis{4-[4-(1,2-dicarboxy)phenoxy]phenyl}ketone dianhydride, bis{4-[3-(1,2-dicarboxy)phenoxy]phenyl}ketone dianhydride, 1,4-bis(3,4-dicarboxyphenoxy)benzene dianhydride, 4,4'-bis[4-(1,2-dicarboxy)phenoxy]biphenyl dianhydride, 4,4'-bis[3-(1,2-dicarboxy)phenoxy]biphenyl dianhydride, bis{4-[4-(1,2-dicarboxy)phenoxy]phenyl}ketone dianhydride, bis{4-[3-(1,2-dicarboxy)phenoxy]phenyl}ketone dianhydride, bis{4-[4-(1,2-dicarboxy)phenoxy]phenyl}sulfone dianhydride, bis{4-[3-(1,2-dicarboxy)phenoxy]phenyl}sulfone dianhydride, bis{4-[4-(1,2-dicarboxy)phenoxy]phenyl}sulfide dianhydride, bis{4-[3-(1,2-dicarboxy)phenoxy]phenyl}sulfide dianhydride, 2,2-bis{4-[4-(1,2-dicarboxy)phenoxy]phenyl}-1,1,1,3,3,3-hexafluoropropane dianhydride, 2,2-bis{4-[3-(1,2-dicarboxy)phenoxy]phenyl}-1,1,1,3,3,3-propane dianhydride, 2,3,6,7-naphthalenetetracarboxylic dianhydride, 1,4,5,8-naphthalenetetracarboxylic dianhydride, 1,2,5,6-naphthalenetetracarboxylic dianhydride, 1,2,3,4-benzenetetracarboxylic dianhydride, 3,4,9,10-perylenetetracarboxylic dianhydride, 2,3,6,7-anthracenetetracarboxylic dianhydride, and 1,2,7,8-phenanthrenetetracarboxylic dianhydride.

These may be used alone or in the form of a mixture of two or more thereof.

From the viewpoint of the heat resistance, the coefficient of linear thermal expansion and others of the polyimide resin, a preferably used species of the tetracarboxylic dianhydride is an aromatic tetracarboxylic dianhydride. Particularly preferably usable examples of the tetracarboxylic dianhydride include pyromellitic dianhydride, mellophanic dianhydride, 3,3',4,4'-benzophenonetetracarboxylic dianhydride, 3,3',4,4'-biphenyltetracarboxylic dianhydride, 2,3,3',4-biphenyltetracarboxylic dianhydride, 2,3,2',3'-biphenyltetracarboxylic dianhydride, 2,2',6,6'-biphenyltetracarboxylic dianhydride, bis(3,4-dicarboxyphenyl)ether dianhydride, and 2,2-bis(3,4-dicarboxyphenyl)-1,1,1,3,3,3-hexafluoropropane dianhydride.

Of these examples, particularly preferred are 3,3',4,4'-biphenyltetracarboxylic dianhydride, 2,3,3',4'-biphenyltetracarboxylic dianhydride, 2,3,2',3'-biphenyltetracarboxylic dianhydride, and bis(3,4-dicarboxyphenyl)ether dianhydride to decrease the coefficient of hygroscopic expansion.

In the case of using, as the tetracarboxylic dianhydride to be used together, a tetracarboxylic dianhydride to which fluorine is introduced, the resultant polyimide resin is lowered in coefficient of hygroscopic expansion. However, a precursor of a polyimide resin having a skeleton containing fluorine is not easily dissolved in an aqueous basic solution. Thus, it is necessary to develop the precursor with a mixed solution composed of an organic solvent such as an alcohol, and an aqueous basic solution.

It is preferred to use a rigid tetracarboxylic dianhydride, such as pyromellitic dianhydride, mellophanic dianhydride, 3,3',4,4'-biphenyltetracarboxylic dianhydride, 2,3,3',4'-biphenyltetracarboxylic dianhydride, 2,3,2',3'-biphenyltetracarboxylic dianhydride, or 1,4,5,8-naphthalenetetracarboxylic dianhydride since the use makes the coefficient of linear thermal expansion of the polyimide resin small. Particularly preferred are 3,3',4,4'-biphenyltetracarboxylic dianhydride, 2,3,3',4'-biphenyltetracarboxylic dianhydride, and 2,3,2',3'-biphenyltetracarboxylic dianhydride from the viewpoint of a balance between the coefficient of linear thermal expansion and the coefficient of hygroscopic expansion.

When the tetracarboxylic dianhydride has an alicyclic skeleton, the polyimide precursor is improved in transparency so that the precursor can be converted to a photosensitive polyimide resin with a high sensitivity. However, this polyimide resin tends to be poorer in heat resistance and insulating performance than aromatic polyimide resin.

In the case of using an aromatic tetracarboxylic dianhydride, there is produced an advantage that the dianhydride is turned to a polyimide resin excellent in heat resistance and low in coefficient of linear thermal expansion. It is therefore preferred in the polyimide resin that 33% or more by mole of the whole of $R^1$s in the formula (I) has one or more of the following formulae:

[Chemical Formula 2]

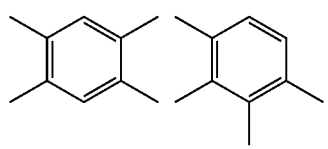

-continued

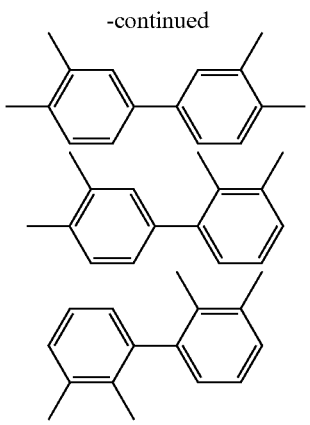

When the above-mentioned polyimide resin contains one or more of these formulae, the resin exhibits a low coefficient of linear thermal expansion and a low coefficient of hygroscopic expansion because of these rigid skeletons. Furthermore, such skeleton-containing polyimide resins have advantages of being commercially available with ease, and being inexpensive.

The polyimide resin having a structure as described above is a polyimide resin high in heat resistance and low in coefficient of linear thermal expansion. Thus, the content by percentage of one or more of the respective structures represented by the above-mentioned formulae is more preferably closer to 100% by mole of the whole of $R^1$s in the formula (I). It is sufficient that the structures are contained at least in a proportion of 33% or more by mole of the whole of Rs in the formula (I). The content by percentage of one or more of the respective structures represented by the above-mentioned formulae is preferably 50% or more, and more preferably 70% or more by mole of the whole of $R^1$s in the formula (I).

About the diamine component usable for the polyimide resin, a single species thereof may be used alone, or two or more species thereof may be used in combination. The usable diamine component is not particularly limited. Examples thereof include p-phenylenediamine, m-phenylenediamine, o-phenylenediamine, 3,3'-diaminodiphenyl ether, 3,4'-diaminodiphenyl ether, 4,4'-diaminodiphenyl ether, 3,3'-diaminodiphenylsulfide, 3,4'-diaminodiphenylsulfide, 4,4'-diaminodiphenylsulfide, 3,3'-diaminodiphenylsulfone, 3,4'-diaminodiphenylsulfone, 4,4'-diaminodiphenylsulfone, 3,3'-diaminobenzophenone, 4,4'-diaminobenzophenone, 3,4'-diaminobenzophenone, 3,3'-diaminodiphenylmethane, 4,4'-diaminodiphenylmethane, 3,4'-diaminodiphenylmethane, 2,2-di(3-aminophenyl)propane, 2,2-di(4-aminophenyl)propane, 2-(3-aminophenyl)-2-(4-aminophenyl)propne, 2,2-di(3-aminophenyl)-1,1,1,3,3,3-hexafluoropropane, 2,2-di(4-aminophenyl)-1,1,1,3,3,3-hexafluoropropane, 2-(3-aminophenyl)-2-(4-aminophenyl)-1,1,1,3,3,3-hexyluoropropane, 1,1-di(3-aminophenyl)-1-phenylethane, 1,1-di(4-aminophenyl)-1-phenylethane, 1-(3-aminophenyl)-1-(4-aminophenyl)-1-phenylethane, 1,3-bis(3-aminophenoxy)benzene, 1,3-bis(4-aminophenoxy)benzene, 1,4-bis(3-aminophenoxy)benzene, 1,4-bis(4-aminophenoxy)benzene, 1,3-bis(3-aminobenzoyl)benzene, 1,3-bis(4-aminobenzoyl)benzene, 1,4-bis(3-aminobenzoyl)benzene, 1,4-bis(4-aminobenzoyl)benzene, 1,3-bis(3-amino-α,α-dimethylbenzyl)benzene, 1,3-bis(4-amino-α,α-dimethylbenzyl)benzene, 1,4-bis(3-amino-α,α-dimethylbenzyl)benzene, 1,4-bis(4-amino-α,α-dimethylbenzyl)benzene, 1,3-bis(3-amino-α,α-ditrifluoromethylbenzyl)benzene, 1,3-bis(4-amino-α,α-ditrifluoromethylbenzyl)benzene, 1,4-bis(3-amino-α,α-ditrifluoromethylbenzyl)benzene, 1,4-bis(4-amino-α,α-ditrifluoromethylbenzyl)benzene, 2,6-bis(3-aminophenoxy)benzonitrile, 2,6-bis(3-aminophenoxy)pyridine, 4,4'-bis(3-aminophenoxy)biphenyl, 4,4'-bis(4-aminophenoxy)biphenyl, bis[4-(3-aminophenoxy)phenyl]ketone, bis[4-(4-aminophenoxy)phenyl]ketone, bis[4-(3-aminophenoxy)phenyl]sulfide, bis[4-(4-aminophenoxy)phenyl]sulfide, bis[4-(3-aminophenoxy)phenyl]sulfone, bis[4-(4-aminophenoxy)phenyl]sulfone, bis[4-(3-aminophenoxy)phenyl]ether, bis[4-(4-aminophenoxy)phenyl]ether, 2,2-bis[4-(3-aminophenoxy)phenyl]propane, 2,2-bis[4-(4-aminophenoxy)phenyl]propane, 2,2-bis[3-(3-aminophenoxy)phenyl]-1,1,1,3,3,3-hexafluoropropane, 2,2-bis[4-(4-aminophenoxy)phenyl]-1,1,1,3,3,3-hexafluoropropane, 1,3-bis[4-(3-aminophenoxy)benzoyl]benzene, 1,3-bis[4-(4-aminophenoxy)benzoyl]benzene, 1,4-bis[4-(3-aminophenoxy)benzoyl]benzene, 1,4-bis[4-(4-aminophenoxy)benzoyl]benzene, 1,3-bis[4-(3-aminophenoxy)-α,α-dimethylbenzyl]benzene, 1,3-bis[4-(4-aminophenoxy)-α,α-dimethylbenzyl]benzene, 1,4-bis[4-(3-aminophenoxy)-α,α-dimethylbenzyl]benzene, 1,4-bis[4-(4-aminophenoxy)-α,α-dimethylbenzyl]benzene, 4,4'-bis[4-(4-aminophenoxy)benzoyl]diphenyl ether, 4,4'-bis[4-(4-amino-α,α-dimethylbenzyl)phenoxy]benzophenone, 4,4'-bis[4-(4-amino-α,α-dimethylbenzyl)phenoxy]diphenylsulfone, 4,4'-bis[4-(4-aminophenoxy)phenoxy]diphenylsulfone, 3,3'-diamino-4,4'-diphenoxybenzophenone, 3,3'-diamino-4,4'-dibiphenoxybenzophenone, 3,3'-diamino-4-phenoxybenzophenone, 3,3'-diamino-4-biphenoxybenzophenone, 6,6'-bis(3-aminophenoxy)-3,3,3',3'-tetramethyl-1,1'-spirobiindane, 6,6'-bis(4-aminophenoxy)-3,3,3',3'-tetramethyl-1,1'-spirobiindane, 1,3-bis(3-aminopropyl)tetramethyldisiloxane, 1,3-bis(4-aminobutyl)tetramethyldisiloxane, α,ω-bis(3-aminopropyl)polydimethylsiloxane, α,ω-bis(3-aminobutyl)polydimethylsiloxane, bis(aminomethyl)ether, bis(2-aminoethyl) ether, bis(3-aminopropyl)ether, bis(2-aminomethoxy)ethyl]ether, bis[2-(2-aminoethoxy)ethyl]ether, bis[2-(3-aminoprothoxy)ethyl]ether, 1,2-bis(aminomethoxy)ethane, 1,2-bis(2-aminoethoxy)ethane, 1,2-bis[2-(aminomethoxy)ethoxy]ethane, 1,2-bis[2-(2-aminoethoxy)ethoxy]ethane, ethylene glycol bis(3-aminopropyl) ether, diethylene glycol bis(3-aminopropyl) ether, triethylene glycol bis(3-aminopropyl)ether, ethylenediamine, 1,3-diaminopropane, 1,4-diaminobutane, 1,5-diaminopentane, 1,6-diaminohexane, 1,7-diaminoheptane, 1,8-diaminooctane, 1,9-diaminononane, 1,10-diaminodecane, 1,11-diaminoundecane, 1,12-diaminododecane, 1,2-diaminocyclohexane, 1,3-diaminocyclohexane, 1,4-diaminocyclohexane, 1,2-di(2-aminoethyl)cyclohexane, 1,3-di(2-aminoethyl)cyclohexane, 1,4-di(2-aminoethyl)cyclohexane, bis(4-aminocyclohexyl)methane, 2,6-bis(aminomethyl)bicycle[2.2.1]heptane, and 2,5-bis(aminomethyl)bicycle[2.2.1]heptane. The following are also usable: diamines each obtained by substituting hydrogen atoms on the aromatic ring of any one of the above-mentioned diamines partially or wholly with one or two or more substituents selected from fluoro, methyl, methoxy, trifluoromethyl, and trifluoromethoxy groups.

The following are also usable: compounds each obtained by introducing, into a part or the whole of hydrogen atoms on the aromatic ring of any one of the above-mentioned diamines, one or more selected from ethynyl, benzocyclobutene-4'-yl, vinyl, allyl, cyano, isocyanate, and isopropenyl groups, which each become a cross-linking point, in accordance with the purpose.

The diamine is selectable in accordance with a target physical property. In the case of using a rigid diamine such as p-phenylenediamine, the polyimide resin becomes low in coefficient of expansion. The rigid diamine may be a diamine in which two amino groups are bonded to the same aromatic ring. Examples thereof include p-phenylenediamine, m-phenylenediamine, 1,4-diaminonaphthalene, 1,5-diaminonaphthalene, 2,6-diaminonaphthalene, 2,7-diaminoaphthalene, and 1,4-diaminoanthracene.

Another example of the diamine component is a diamine in which two or more aromatic rings are bonded to each other through a single bond, and two or more amino groups are bonded onto the different aromatic rings, respectively, directly or in the form of a part of their substituents. This diamine is, for example, a diamine represented by a formula (II) illustrated below. A specific example thereof is benzidine.

[Chemical Formula 3]

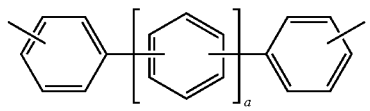

(II)

in which "a" is 0 or a natural number of 1 or more, and amino groups are each bonded at a m-position or p-position to a bond between the benzene rings.

Furthermore, a diamine is usable which has, in the formula (II), substituents at benzene ring positions that are not related to any bonding to the other benzene rings, and that have no amino group as a substituent. These substituents are each a monovalent organic group, and may be bonded to each other. Specific examples thereof include 2,2'-dimethyl-4,4'-diaminobiphenyl, 2,2'-ditrifluoromethyl-4,4'-diaminobiphenyl, 3,3'-dichloro-4,4'-diaminobiphenyl, 3,3'-dimethoxy-4,4'-diaminobiphenyl, and 3,3'-dimethyl-4,4'-diaminobiphenyl.

When fluorine is introduced as a substituent of the aromatic ring, the polyimide resin can be decreased in coefficient of hygroscopic expansion. However, a fluorine-containing polyimide resin precursor, particularly, fluorine-containing polyamic acid is not easily dissolved in an aqueous basic solution; thus, when the insulating layer is partially formed on a support base material, it may be necessary for working the insulating layer to develop the precursor with a mixed solution of the aqueous basic solution and an organic solvent such as an alcohol.

Apart from the above, in the case of using, as the diamine, a diamine having a siloxane skeleton, such as 1,3-bis(3-aminopropyl)tetramethyldisiloxane, an improvement can be made in adhesiveness between the support base material and the insulating layer, and the polyimide resin can be lowered in elastic modulus and glass transition temperature.

The diamine to be selected is preferably an aromatic diamine from the viewpoint of heat resistance. It is however allowable to use a diamine other than any aromatic diamine, such as an aliphatic diamine or a siloxane type diamine, in accordance with a target physical property as far as the content by percentage thereof does not exceed 60% by mole of the whole of the diamines, and preferably 40% by mole thereof.

In the above-mentioned polyimide resin, it is preferred that in the formula (I), 33% or more by mole of the whole of $R^2$s has one or more of the following formulae:

[Chemical Formula 4]

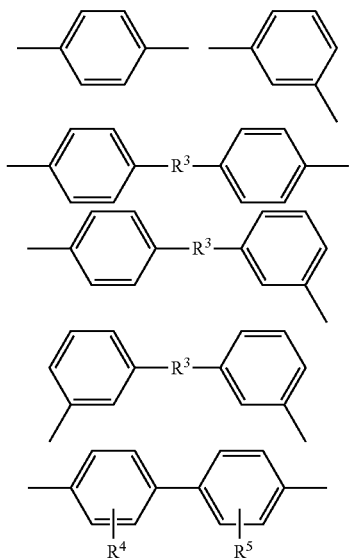

in which $R^3$s are each a bivalent organic group, an oxygen atom, a sulfur atom or a sulfone group, and $R^4$ and $R^5$ are each a monovalent organic group, or a halogen atom.

When the polyimide resin has one or more of the respective structures represented by these formulae, the polyimide resin exhibits a low coefficient of linear thermal expansion and a low coefficient of hygroscopic expansion because of the rigid skeleton thereof. Furthermore, the polyimide resin has advantages of being commercially available with ease, and being inexpensive.

When the polyimide resin has one or more of these structures, the resin is improved in heat resistance and is reduced in coefficient of linear thermal expansion. Thus, it is more preferred that in the formula (I), the content by percentage thereof in the whole of $R^2$s is closer to 100% by mole. It is advisable that in the formula (I), the content by percentage thereof in the whole of $R^2$s is set to at least 33% by mole. The content by percentage of one or more of the above-mentioned structures in the whole of $R^2$s in the formula (I) is preferably 50% or more by mole, and even more preferably 70% or more by mole.

About one or more tetracarboxylic dianhydrides and one or more diamines which are raw materials that are to constitute the polyimide resin contained as a main component, it is preferred in the invention that the proportion of bendable raw materials is small in order to cause the non-thermoplastic polyimide resin to have a desired storage elastic modulus. In other words, in the tetracarboxylic dianhydride(s) and the diamine(s), which are to constitute the polyimide resin, small is preferably the content by percentage of any tetracarboxylic dianhydride having a bendable structure and any diamine having a bendable structure.

The tetracarboxylic dianhydride having a bendable structure is not particularly limited as far as the dianhydride has a flexible skeleton and causes the polyimide resin to be lowered in storage elastic modulus and Tg. Examples thereof include tetracarboxylic dianhydrides described in Newest Polyimide/Basis and Application, Yoshio Imai, Rikio Yokota, NTS, pp. 241-252 (2002), Newest Trend IV of Advancing Polyimide, S.B. Research Co., Ltd., pp. 3-12, and WO2007/015396. More specific examples thereof include tetracarboxylic dianhydrides which each have a soft structure such as an alkyl, ether, sulfone, ketone or sulfide group. This bendable tetracarboxylic dianhydride may be a compound represented by the following general formula (III):

[Chemical Formula 5]

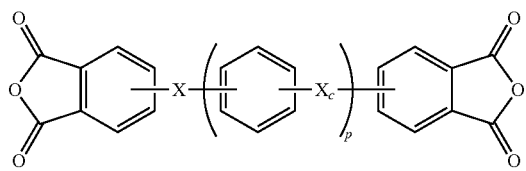
(III)

in which X, and Xc(s) are each a group selected from the group consisting of respective bivalent organic groups represented by general formulas illustrated below; in a single molecule of the compound, Xc's may be the same or different, and the groups as Xc's may each be selected at will about its right and left directions; and "p" is an integer of 0 or more.

[Chemical Formula 6]

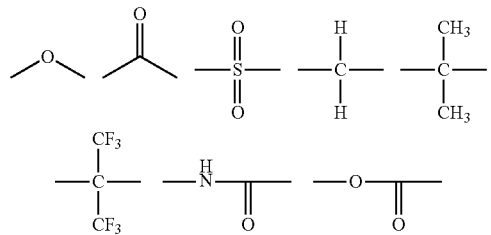

In the invention, "p" is preferably 2 or less, more preferably 1 or less, and in particular preferably 0. When "p" is in this range, the tetracarboxylic dianhydride can be lowered in bendability, and heightened in storage elastic modulus.

In the invention, the content by percentage of the tetracarboxylic dianhydride having a bendable structure in the entire tetracarboxylic dianhhydrides which constitute the polyimide resin is not particularly limited as far as the content by percentage permits the production of a non-thermoplastic polyimide resin having a desired storage elastic modulus. The content by percentage is appropriately set in accordance with the species of the tetracarboxylic dianhydride having the bendable structure, the species of the other tetracarboxylic dianhydride(s) and the diamine component(s), and other factors. The content by percentage is preferably 50% or less by mass, and more preferably 25% or less by mass. In particular preferably, the content by percentage is 0%, that is, no tetracarboxylic having a bendable structure is contained. When the content by percentage is in this range, the polyimide can easily be produced with a desired storage elastic modulus.

Incidentally, the wording "the content by percentage in the entire tetracarboxylic dianhhydrides which constitute the polyimide resin" denotes the content by percentage of the tetracarboxylic dianhydride having a bendable structure in all the tetracarboxylic dianhhydrides as monomers.

The diamine having a bendable structure is not particularly limited as far as the diamine has a flexible structure, and causes the polyimide resin to be lowered in storage elastic modulus and Tg. Examples thereof include diamines described in the above-mentioned "Newest Polyimide/Basis and Application". More specific examples thereof include diamines which each have a soft structure such as an alkyl, ether, sulfone, ketone or sulfide group. This bendable diamine may be a compound represented by the following general formula (IV):

[Chemical Formula 7]

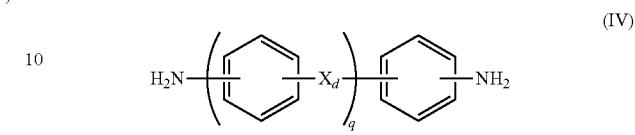
(IV)

in which Xd(s) is/are (each) the same bivalent organic group as described about Xc(s); in a single molecule of the compound, all of Xds may be the same or different, and the groups as Xds may each be selected at will about its right and left directions; and "q" is an integer of 1 or more.

Furthermore, a diamine is usable in the formula (IV), hydrogen atoms on one or more of the aromatic rings are partially or wholly substituted with one or more substituents selected from halogen atoms, and methyl, methoxy, trifluoromethyl and trifluoromethoxy groups. Its benzene ring positions that are not related to bonding to the other benzene rings and that have no amino group as a substituent may have substituents. These substituents are each a monovalent organic group, and may be bonded to each other. The aromatic rings have each been illustrated by a benzene ring. However, the aromatic ring may be an aromatic heterocycle, such as pyridine, or a polycyclic aromatic ring, such as a naphthalene ring. A compound in which aromatic rings are bonded to each other through a single bond, such as biphenyl, may be used.

In the invention, "q" is preferably 3 or less, more preferably 2 or less, and in particular preferably 1. When "q" is in this range, the diamine can be lowered in bendability, and heightened in storage elastic modulus.

In the invention, the content by percentage of the diamine having a bendable structure in the entire diamines which constitute the polyimide resin is not particularly limited as far as the content by percentage permits the production of a non-thermoplastic polyimide resin having a desired storage elastic modulus. For example, a diamine in which "q" is 1, such as 4,4'-diaminodipneyl ether or 3,4'-diaminodiphenyl ether, has only one bending moiety, such as an ether bond; thus, the diamine is relatively low in bendability to be smaller in advantage of making the polyimide thermoplastic than other diamines. In light of such a matter, the content by percentage is appropriately set in accordance with the species of the diamine having a bendable structure, the species of tetracarboxylic dianhydride(s) and the diamine component(s), and other factors. About one or more diamines about which "q" is 2 or more, the content by percentage thereof is preferably 50% or less by mass, and more preferably 25% or less by mass. In particular preferably, the content by percentage is 0%, that is, the diamine(s) is/are not contained. About one or more diamines about which "q" is 1, the content by percentage thereof is preferably 80% or less by mass, more preferably 60% or less by mass, and in particular preferably 40% or less by mass. When the content by percentage is in this range, the polyimide can easily be produced with a desired storage elastic modulus.

The wording "the content by percentage in the entire diamines which constitute the polyimide resin" denotes the content by percentage of the diamine having a bendable structure in all the diamines as monomers.

The polyimide resin having repeating units each represented by the formula (I) may be a resin obtained by use of a photosensitive polyimide resin having a polyimide component which is to be a polyimide resin by heat treatment or any other imidizing treatment (curing), and a photosensitizer. The photosensitive polyimide resin may be, for example, a solvent developable negative photosensitive polyimide resin obtained by introducing ethylenic double bonds to carboxyl groups of a polyamic acid by effect of ester bonds or ion bonds, and then blending, into the resultant polyimide resin precursor, a radical photoinitiator as a photosensitizer. Moreover, the photosensitive polyimide resin may be, for example, an alkali developable positive photosensitive polyimide resin obtained by adding a naphthoquinonediazide compound as a photosensitizer to a polyamic acid or a partially esterified product thereof; or an alkali developable negative photosensitive polyimide resin obtained by adding an optical base generator as a photosensitizer to a polyamic acid, for example, an alkali developable negative photosensitive polyimide resin obtained by adding a nifedipine type compound as a photosensitizer to a polyamic acid.

About each of these photosensitive polyimide resins, the photosensitizer is added in an amount of 15 to 35% by weight of the polyimide component. Thus, even when the heat dissipating substrate is patterned and subsequently heated to 300 to 400° C., a residue originating from the photosensitizer remains in the polyimide resin. The residue causes the heat dissipating substrate to be increased in coefficient of linear thermal expansion and coefficient of hygroscopic expansion. Consequently, the use of the photosensitive polyimide resin tends to cause the heat dissipating substrate to undergo peel therein, warp, or some other damage more easily than the use of any non-photosensitive polyimide resin. However, the photosensitive polyimide resin in which an optical base generator is added as a photosensitizer to a polyamic acid can be patterned even when the addition amount of the optical base generator as the photosensitizer is set to 15% or less. Thus, even after the polyamic acid is turned to a polyimide resin as described above, a decomposition residue originating from the photosensitizer is small in quantity so that the polyimide resin is rarely deteriorated in properties such as coefficient of linear thermal expansion, and coefficient of hygroscopic expansion. Furthermore, an out gas is rarely generated. Thus, this polyimide resin is most preferred as a photosensitive polyimide resin usable in the invention.

It is preferred that the photosensitive polyimide resin, which is used to form the above-mentioned polyimide resin, is developable with an aqueous basic solution when the insulating layer is partially formed on the support base material from a viewpoint of keeping the safety of an environment for the working and decreasing costs for the process. The aqueous basic solution can be obtained at lower costs, and takes lower costs for waste liquid treatment and lower costs for facilities for keeping the working safety than organic solvents. Thus, the photosensitive polyimide resin makes it possible to produce the heat dissipating substrate of the invention at lower costs.

In order to form the above-mentioned polyimide resin in the invention, a non-photosensitive polyimide resin is usable which contains the above-mentioned polyimide but does not substantially contain any photosensitizer.

Incidentally, the wording "does not substantially contain any photosensitizer" denotes that the photosensitizer content by percentage is not more than a content by percentage that does not permit a precise patterning under ordinary light-exposure and developing conditions for photosensitive polyimide resins each used in a heat dissipating substrate.

The non-thermoplastic polyimide resin used in the invention may optionally contain additives such as a leveling agent, a plasticizer, a surfactant, and an antifoaming agent.

(2) Insulating Layer

The insulating layer used in the invention is formed directly on the above-mentioned support base material, and is made of the above-mentioned non-thermoplastic polyimide resin.

The layer structure of the insulating layer used in the invention may be a mono-layered structure or multi-layered structure as far as the structure is made of the non-thermoplastic polyimide resin. The layer structure is preferably made substantially of a single layer. In this case, the insulating layer having a thickness in the above-mentioned range can easily be formed.

The wording "made substantially of a single layer" denotes a layer formed by applying a single material or subjecting the material to any other operation, and does not include, in the meanings thereof, any layer obtained by forming two or more materials prepared separately from each other into the form of layers by coextrusion or some other method, one or more interfaces between these layers being continuously changed. The wording does not include, in the meanings thereof, for example, a layer formed by jetting out two materials into two layers, an interface between these layers being continuously changed, that is, the respective concentrations of the two materials being continuously changed.

The thickness of the insulating layer used in the invention is not particularly limited as far as the thickness is within the range of $\mu$m 1 to 20 $\mu$m, and makes it possible to cause this layer to exhibit a desired insulating performance to prevent a short circuit between the support base material and the wiring layer, and further exhibit a desired heat dissipating performance. The thickness is set correspondingly to a required withstand voltage.

Specifically, when the heat dissipating substrate is used as an article requiring a high withstand voltage, in which the used voltage is 1 kV or more, it is preferred in the invention that the thickness ranges from 10 $\mu$m to 20 $\mu$m.

When the used voltage is from about 0.5 kV to 1 kV, the thickness ranges preferably from 1 $\mu$m to 15 $\mu$m, and more preferably from 5 $\mu$m to 10 $\mu$m.

When a high withstand voltage is not required, for example, for home use, specifically, the used voltage is less than 0.5 kV, particularly, 0.3 kV or less, the thickness ranges preferably from 1 $\mu$m to 10 $\mu$m, and preferably from 1 $\mu$m to 7 $\mu$m from the viewpoint of heat dissipating performance.

Specifically, the coefficient of linear thermal expansion of the insulating layer is not particularly limited as far as the coefficient makes it possible to restrain the generation of peel, warp, or other damages when the heat dissipating substrate of the invention is used. The coefficient of linear thermal expansion ranges preferably from 0 ppm/° C. to 40 ppm/° C. from the viewpoint of dimensional stability. If the coefficient of linear thermal expansion is too large, the insulating layer is largely stretched and shrunken when changed in temperature. Thus, a bad effect is produced on the dimensional stability of the substrate. Moreover, this range makes it possible to restrain sufficiently the generation of peel, warp and other damages even when the support base material is a base made of a metal material excellent in heat dissipating performance, such as copper or aluminum.

The coefficient of linear thermal expansion is measured as follows. First, a film made only of the non-thermoplastic polyimide resin is produced. The following methods therefor are known: a method of producing a film (insulating layer) made only of the non-thermoplastic polyimide resin formed on the support base material, and then peeling the non-thermoplastic polyimide resin film; and a method of producing a film of the non-thermoplastic polyimide resin (insulating layer) on the support base material, and then etching the metal to be removed, thereby yielding the non-thermoplastic polyimide resin film. Next, the resultant non-thermoplastic polyimide resin film is cut into pieces each having a size of 5 mm width and 20 mm length. The cut films are used as evaluating samples. The coefficient of linear thermal expansion is measured by means of a thermomechanical analyzer (such as Thermo Plus TMA 8310™ (manufactured by Rigaku Corp.)). Conditions for the measurement are as follows: the temperature-raising rate is set to 10° C./minute, and the tension load is set to 1 g/25000-µm$^2$ to make loads onto the evaluating samples equal to each other per area of their cross sections; and the average of the coefficient of linear thermal expansions within the range of 100° C. to 200° C. is defined as the coefficient of linear thermal expansion (C.T.E.).

The difference in coefficient of linear thermal expansion between the insulating layer used in the invention and the support base material is preferably 15 ppm/° C. or less, more preferably 10 ppm/° C. or less, and even more preferably 5 ppm/° C. or less from the viewpoint of dimensional stability. As the coefficient of linear thermal expansion of the insulating layer is closer to that of the support base material, the heat dissipating substrate of the invention is further restrained from being warped and further a stress becomes smaller in the interface between the insulating layer and the support base material when the heat dissipating substrate is changed in thermal environment therearound, so that adhesiveness is made higher therebetween. It is preferred that the heat dissipating substrate of the invention is not warped in the temperature environment of 0° C. to 100° C. in light of the handleability thereof; however, when the coefficient of linear thermal expansion of the insulating layer is large in contrast to the case mentioned just above so that the difference in coefficient of linear thermal expansion is large between the insulating layer and the support base material, the heat dissipating substrate is unfavorably warped by a change in a thermal environment therearound.

Incidentally, the wording "the heat dissipating substrate is not warped" denotes that when the heat dissipating substrate is cut out into a strip of 10 mm width and 50 mm length and then one of the short sides of the resultant sample is fixed onto a smooth and horizontal stand, the distance of a rise of the other short side of the sample from the top surface of the stand is 1.0 mm or less.

In the case of forming, in the invention, an electronic element, an adhesion layer, an electrode, and other layers together with the wiring layer (wirings) on the insulating layer to have a considerable area (area larger than the area of a half of the support base material) and have a thickness equivalent to or more than that of the support base material, it is desired to make the coefficient of linear thermal expansion of the insulating layer close to the respective coefficient of linear thermal expansions of the layers formed on the insulating layer, such as the electronic element, the adhesion layer, the electrode and the wirings. If the insulating layer is different in coefficient of linear thermal expansion from the layers formed on the insulating layer, the heat dissipating substrate is deteriorated in dimensional stability and undergoes peel therein, warp, and crack.

When the layers formed on the insulating layer are made mainly of an inorganic material, it is desired that the coefficient of linear thermal expansion of the insulating layer is smaller since the inorganic material may have a small coefficient of linear thermal expansion of 10 ppm/° C. or less, examples of the inorganic material including respective oxides of metals such as Zn, In, Ga, Cd, Ti, St, Sn, Te, Mg, W, Mo, Cu, Al, Fe, Sr, Ni, Ir and Mg; respective oxides of nonmetals such as Si, Ge and B; respective nitrides, sulfides and selenides of these elements; and mixtures of two or more of these examples (the mixtures may be mixtures in which elements are mixed with each other at an atomic level, such as a ceramic material composed of plural elements).

In the invention, specifically, the difference in coefficient of linear thermal expansion between the insulating layer and the layers formed on the insulating layer is preferably 10 ppm/° C. or less, more preferably 5 ppm/° C. or less, and even more preferably 2 ppm/° C. or less.

Out of electronic elements as described above, an EL element, an organic thin film solar cell, a solid-state image sensor, and others are weak against water in many cases. It is therefore preferred that the water absorption of the insulating layer used in the invention is relatively small in order to reduce water inside the elements. An index of water absorption is a coefficient of hygroscopic expansion. Thus, it is more preferred that the coefficient of hygroscopic expansion of the insulating layer is smaller. Specifically, the coefficient of hygroscopic expansion is preferably from 0 ppm/% RH to 15 ppm/% RH, more preferably 0 ppm/% RH to 12 ppm/% RH, and even more preferably from 0 ppm/% RH to 10 ppm/% RH. If the coefficient of hygroscopic expansion of the insulating layer is in this range, the water absorption of the insulating layer can be made sufficiently small so that the heat dissipating substrate of the invention is easily stored. Additionally, when the heat dissipating substrate is used to produce an element, the process therefor becomes simple and easy. As the coefficient of hygroscopic expansion of the insulating layer is smaller, the insulating layer is made higher in dimensional stability. If the coefficient of hygroscopic expansion of the insulating layer is large, the difference in expansion rate between the insulating layer and the support base material, the coefficient of hygroscopic expansion of which is close to about zero, may cause the heat dissipating substrate to be warped with a rise in temperature, or cause adhesiveness therebetween to be declined.

The coefficient of hygroscopic expansion can be measured by means of a humidity-variable mechanical analyzer (Thermo Plus TMA 8310™ (manufactured by Rigaku Corp.)). For example, a temperature of 25° C. is kept, and each sample is made into a stable state at a humidity of 15% RH. This state is kept for about 30 minutes to 2 hours, and then the humidity of its measuring moiety is adjusted to 20% RH. Furthermore, this state is kept for 30 minutes to 2 hours until the sample becomes stable. Thereafter, the humidity is changed to 50% RH. The difference in sample-length between the sample made stable at this humidity and the sample made stable at 20% RH is divided by the change in the humidity (in this case, 50–20=30). The resultant value is divided by the sample length. The resultant value is defined as the coefficient of hygroscopic expansion (C.H.E.). In the measurement, the tension load is set to 1 g/25000-µm$^2$ to make loads onto the evaluating samples equal to each other per area of their cross sections.

The insulating layer used in the invention may be formed on the whole of a surface of the support base material, or may be partially formed on the support base material. In the invention, it is preferred that the support base material and the wiring layer are each independently patterned. In this case, the heat dissipating substrate can easily be rendered a substrate excellent in heat dissipating performance, productivity, and others.

Specifically, the insulating layer is lower in thermoconductivity than the support base material; and thus the insulating layer can be improved in heat dissipating performance by removing an unnecessary region of the insulating layer and then laying out a thermoconductive region made of a metal or the like. In addition, the support base material is higher in barrier performance than the insulating layer; and thus when an element weak against water is arranged as an electronic element onto the wiring layer, a sealing member can be caused to adhere closely onto the support base material by laying out a region where the support base material is exposed. Consequently, the heat dissipating substrate can be more strongly prevented from undergoing the invasion of water.

By forming a sealing region selectively into the region where the support base material is exposed, sealing can be attained in the state that electronic elements are arranged into different zones in the same surface, or are bonded by use of plural surfaces of each of the electronic elements. Thus, an element can be produced with a high productivity.

The method for forming the insulating layer is not particularly limited as far as the method is, for example, a method capable of forming the insulating layer directly onto the support base material. The method may be a method of applying an insulating-layer-forming coating solution capable of forming the insulating layer, for example, a method of applying an insulating-layer-forming coating solution containing a photosensitive polyimide resin as described above, and then subjecting the workpiece to heat treatment. If necessary, the insulating layer may be patterned by, for example, light-exposure and development, or etching using a resist.

The applying method may be, for example, a spin coating, die coating, dip coating, bar coating, gravure printing, or screen printing method.

2. Support Base Material

The support base material used in the invention is a member for supporting the above-mentioned insulating layer and a wiring layer, and has thermoconductivity.

The wording "has thermoconductivity" denotes that the support base material has a thermal conductivity of 10 W/mK or more at room temperature (300 K).

The support base material may be a monolayer, or a laminated body made of plural layers. Incidentally, when the support base material is a laminated body, its layers each have a thermal conductivity of 10 W/mK or more. Accordingly, in a case where the support base material is a laminated body, its thermoconductive adhesive layer is also included in the category of the support base material in the invention, specifically, in a case where the support base material is a tri-layered structure of a copper/a thermoconductive adhesive layer/aluminum, the thermoconductive adhesive layer is also included therein when the thermal conductivity thereof is 10 W/mK or more.

When the value of the thermal conductivity is higher, the value is more preferred. Specifically, the value is more preferably 50 W/mK, in particular preferably 100 W/mK, and more preferably 200 W/mK.

The material constituting the support base material is not particularly limited as far as the material is a thermoconductive material making it possible to support the insulating layer and the wiring layer stably and having a desired thermal conductivity. The material is, for example, a metal material such as aluminum, aluminum alloys, copper, copper alloys, phosphor bronze, stainless steel (SUS), gold, gold alloys, nickel, nickel alloys, silver, silver alloys, tin, tin alloys, titanium, iron, iron alloys, zinc, molybdenum, and INVAR material; or a semiconductor material such as silicon or graphite.

In the invention, preferred is aluminum, copper, silver, gold, an alloy made mainly of any one of these metals, silicon, or graphite since the material makes it possible to make the heat dissipating substrate of the invention high in thermal conductivity and excellent in heat dissipating performance.

When the metal material is used, it is preferred that the metal material is aluminum or copper, or an alloy made mainly of the metal from the viewpoint of costs. When the metal thickness needs to be made large, aluminum is particularly preferred for making the support base material light.

When the support base material is patterned, the material constituting the support base material is preferably a metal material. The metal material is easily worked by a photolithographic method, a directly working method using a laser or punching, or some other method.

When the wiring layer or the insulating layer is patterned, it is preferred that the material constituting the support base material has a process resistance such as chemical liquid resistance or heat resistance.

AS the wiring layer, when a layer contacting with the support base material through the other layer is patterned, the support base material can avoid contacting a chemical liquid by covering an exposed region of the support base material with, for example, a tape. However, as the insulating layer, when a layer contacting with the support base material directly is patterned, it is difficult that the support base material avoids being exposed at the time of the patterning for the following reason: in particular, about a site not covered with a layer that is to be patterned and contacts the support base material directly, the site can be covered with, for example, a tape; however, about a site covered with the layer, which is to be patterned, it is difficult that the layer avoids being exposed when the layer is patterned.

For this reason, when the wiring layer or the insulating layer is patterned, in particular, when the insulating layer is patterned, it is preferred that the support base material has chemical liquid resistance.

Specifically, when the material constituting the support base material is a metal material, the material is preferably copper, silver or gold, which has a high chemical liquid resistance and heat resistance. In the case of using, for the support base material, a metal large in ionization tendency, such as aluminum, or an alloy made mainly of the metal, that is, in a case where the support base material contains, as its core layer, a metal base material made of such a metal large in ionization tendency, or an alloy made mainly of the metal, it is preferred to form a support base material-protective layer or the like. More specifically, when the support base material contains a metal base material made of aluminum or an alloy made mainly of aluminum, the support base material is preferably a base material including a support base material-protective layer formed on the metal base material. This support base material can be improved in chemical resistance so as to be prevented from being invaded by acidic chemical liquid or alkaline chemical liquid, particularly, alkaline chemical liquid. As a result, even when the support base material has a metal base material and the insulating layer is patterned, the support base material can be made stable.

The material constituting the support base material-protective layer in the invention is not particularly limited as far as the material has a desired chemical liquid resistance or the like. The material may be, for example, an alkali-resistant material made mainly of an inorganic material and having a desired alkali resistance.

The alkali-resistant material in the invention is not particularly limited as far as the material is higher in alkali resistance than the material constituting the support base material to be protected. When the support base material is, for example, a base material including a metal base material made of aluminum or an alloy made mainly of aluminum, that is, when the material constituting the support base material is a material made of aluminum or an alloy made mainly of aluminum, examples of the alkali-resistant material include metals such as manganese, zinc, chromium, iron, cadmium, cobalt, nickel, tin, lead, bismuth, copper, silver, palladium, iridium, platinum, gold, gallium, ruthenium, rhodium, indium, osmium, tantalum, titanium, tungsten, and molybdenum, respective oxides, nitrides, sulfides, and selenides of these metals, aluminum, strontium and tellurium, and respective oxides, nitrides, sulfides, and selenides of silicon, germanium and boron. These materials may be used alone, or in the form of a laminated body made of two or more thereof, or may be used in the form of a mixture (the mixture may be a mixture in which elements are mixed with each other at an atomic level, such as a ceramic material composed of plural elements).

In the invention, a location where the alkali-resistant protective layer is formed is not particularly limited as far as the location is a location at which the protective layer is formed to cover at least one portion of a surface of a layer (metal base material) made of a material to be protected. When viewed in plan, the location is preferably a location including the whole of areas where the support base material is exposed when the insulating layer is patterned, in the entire location of the surface on which the insulating layer of the support base material is formed, for the following reason: in the protecting-layer-formed location, the insulating layer is already formed when the insulating layer is patterned, and thus it is difficult to protect the surface of the metal base material newly; and when the insulating layer is removed, it is difficult to prevent the metal base material surface from being exposed.

In the invention, when viewed in plan, the location is preferably a location including the whole of areas where the support base material is exposed when the insulating layer is patterned, in the entire location of the surface on which the insulating layer of the support base material is formed; more preferably a location including the whole of the surface on which the insulating layer of the support base material is formed; even more preferably the entire surfaces of the metal base material from which its end faces are excluded; and even more preferably the entire surfaces of the metal base material.

When the protecting-layer-formed location is a location described just above, the heat dissipating substrate can be effectively restrained from undergoing invasion by an alkali developing solution used when the insulating layer is patterned.

The support base material-protective layer is not particularly limited as far as the layer is formed to protect stably layers that are made of a material to be protected. The support base material-protective layer is formed to cover preferably 40% or more of the area of the entire surfaces of the metal base material, more preferably 80% or more thereof, even more preferably 90% or more thereof, and most preferably 100% thereof. When the protecting-layer-formed area is the above-mentioned area, the heat dissipating substrate can be effectively restrained from undergoing invasion by an alkaline solution, such as an alkali developing solution, used when the insulating layer is patterned.

The thickness of the support base material-protective layer used in the invention is not particularly limited as far as the thickness permits the support base material to be stably protected. The thickness is appropriately set in accordance with an object to be protected by the support base material-protective layer, a chemical liquid against which the heat dissipating substrate is required to have resistance, and other factors. In the invention, it is usually preferred that the thickness is 0.5 µm or more when the support base material includes a metal base material made of aluminum or an alloy made mainly of aluminum, and alkali resistance is given thereto. In this case, the support base material can stably be coated without generating pinholes or other defects.

In a case where the object to be protected is a metal base material made of aluminum or an alloy made mainly of aluminum in the invention, the thickness is preferably 1 µm or more when the support base material-protective layer is a plating layer. When the support base material-protective layer is an oxide layer formed by anodic oxidization, or an oxide layer or sulfide layer formed by chemical conversion treatment, the thickness is preferably 1 µm or more, more preferably 5 µm or more, and in particular preferably 10 µm or more. When the thickness is in this range, the support base material can be stably protected even from a very strong alkaline solution, such as an etching solution or resist peeling solution used when the method for patterning the insulating layer is a method of forming a resist into a pattern form onto a polyimide film obtained by imidizing a polyimide precursor, and subsequently or simultaneously etching the polyimide film to be patterned and next peeling the resist.

Incidentally, as the thickness is larger, the thickness is more preferred since the protective layer makes the heat dissipating substrate higher in alkali resistance; thus, the upper limit thereof is not particularly limited. However, as the thickness is made larger, costs become higher. Thus, the thickness is usually set to 100 µm or less.

The method for forming the support base material-protective layer used in the invention is not particularly limited as far as the method is a method capable of forming the layer stably onto the surface of the support base material. The method is preferably a method using plating treatment, anodic oxidization (alumite) treatment, or chemical conversion treatment. In other words, the support base material-protective layer is preferably an oxide layer formed by anodic oxidization treatment, an oxide layer or sulfide layer formed by chemical conversion treatment, or a plating layer. When the support base material-protective layer is a layer formed by such a method, the support base material having the support base material-protective layer can easily be formed.

In the invention, the support base material-protective layer is, among these layers, more preferably a plating layer or an oxide layer formed by anodic oxidization treatment, in particular preferably a plating layer. When the method using plating treatment is used, the support base material-protective layer can have a desired alkali resistance even when the layer is thin.

Incidentally, in the invention, the above-mentioned methods may be used in combination. Specifically, the support base material-protective layer may be formed by conducting electroless plating initially, and then conducting electroplating.

The plating method in the invention may be an ordinarily used plating method. Specific examples thereof include wet plating methods (electroplating and electroless plating methods), and dry plating methods (vacuum vapor deposition, sputtering and metallikon methods).

In the invention, among these methods, wet plating methods are preferred, and an electroplating method is particularly preferred. The methods make it possible to form a denser plating layer. As a result thereof, even when the support base material-protective layer is thin, the layer can make the heat dissipating substrate sufficiently higher in alkali resistance.

Moreover, wet plating is high in plating speed so that the plating period can be shortened.

Electroplating, which is used as one of the wet plating methods in the invention, is a method of using an electroconductive matter as a cathode to cause a direct current to flow into an electrolytic solution containing a substance desired to form plating, thereby reducing and precipitating the substance (such as a metal) electrically onto the surface of the electroconductive matter to form a layer.

The metal in the case of conducting electroplating in the invention is not particularly limited as far as the metal is higher in chemical liquid resistance than the support base material to be protected. Examples thereof include manganese, zinc, chromium, iron, cadmium, cobalt, nickel, tin, lead, bismuth, copper, silver, palladium, iridium, platinum, gold, gallium, ruthenium, rhodium, indium, and osmium.

The electroless plating method in the invention is a method of reducing and precipitating, in a solution containing a substance desired to form plating, the substance (such as a metal) electrically on the surface of the object to be plated, not by electrons generated by electrical conduction but by electrons emitted by the oxidization of a reducing agent contained in the solution, to form a layer.

The electroless plating method has advantages that: the resultant plating can be reduced in thickness unevenness; and even when an object on which the support base material-protective layer is to be formed is a metal base material made of aluminum or an alloy made mainly of aluminum, the resultant plating can be reduced in unevenness since a matter to be plated does not require electroconductivity when plated. The method also has an advantage that even when the surface of the support base material has irregularities, the formed plating can be made even in thickness.

The metal in the case of conducting the electroless plating in the invention is not particularly limited as far as the metal is higher in chemical liquid resistance than the support base material to be protected. Examples thereof include cadmium, cobalt, nickel, tin, lead, bismuth, copper, silver, palladium, platinum, gold, ruthenium, rhodium, and indium.

The dry plating in the invention is a method of gasifying, ionizing or liquefying a metal, an oxide, a nitride or the like, and then causing the material to adhere onto the surface of a material, thereby forming a layer thereon.

The metal in the case of conducting the dry plating in the invention is not particularly limited as far as the metal is higher in chemical liquid resistance than the support base material to be protected. When the support base material is a metal base material made of aluminum or an alloy made mainly of aluminum, examples thereof include manganese, zinc, chromium, iron, cadmium, cobalt, nickel, tin, lead, bismuth, copper, silver, palladium, iridium, platinum, titanium, tungsten, and molybdenum.

An advantage of the dry plating is that respective oxides and nitrides of a metal and a nonmetal, or the like, as well as a metal can each be laminated.

Specifically, respective coats of the following materials can be formed: respective oxides of metals such as Cr, Zn, In, Ga, Cd, Ti, Sn, Te, Mg, W, Mo, Cu, Al, Fe, Sr, Ni, Ir and Mg; respective oxides of nonmetals such as Si, Ge and B; respective nitrides, sulfides and selenides of these elements; and mixtures of these examples.

The anodic oxidization treatment method in the invention is a method of using an electroconductive matter as an anode in an electrolytic solution to cause a direct current to flow into the solution, thereby oxidizing the electroconductive matter electrically to form an oxide layer (oxide coat layer) onto the surface.

The electrolytic solution when the anodic oxidization is conducted in the invention is not particularly limited as far as the solution is an electrolytic solution capable of forming an oxide coat having a sufficient thickness on the support base material to be protected. A bath of the electrolytic solution is, for example, an acidic bath such as a sulfuric acid bath, oxalic acid bath, chromic acid bath or phosphoric acid bath, or an alkaline bath such as a sodium hydroxide bath or ammonia bath.

The chemical conversion treatment in the invention is a method of using a chemical reaction such as oxidization or sulfurization in a solution to react the surface of the support base material chemically, thereby forming an corrosion-resistant coat such as an oxide layer (oxide coat) or a sulfide layer (sulfide coat).

The chemical conversion treatment has an advantage that the corrosion-resistant coat can easily be formed on the entire surfaces (including the end faces) since the coat can be formed without connecting any electrode.

When the chemical conversion treatment in the invention is conducted, the solution is not particularly limited as far as the solution is a solution capable of forming a corrosion-resistant coat having a sufficient thickness onto the support base material to be protected. Examples thereof include phosphoric acid/chromate based, chromate based, alkali/chromate based, boehmite based, zirconium based, and zinc phosphate based solutions.

The coefficient of linear thermal expansion of the support base material used in the invention is preferably from 0 ppm/° C. to 25 ppm/° C. from the viewpoint of dimensional stability. Incidentally, about a method for measuring the coefficient of linear thermal expansion, the support base material is cut into pieces each having a size of 5 mm width and 20 mm length, and each of the pieces is used as an evaluating sample to make the measurement by means of a thermomechanical analyzer (such as Thermo Plus TMA 8310™ (manufactured by Rigaku Corp.)). Conditions for the measurement are as follows: the temperature-raising rate is set to 10° C./minute, and the tension load is set to 1 g/25000-$\mu m^2$ to make loads onto the evaluating samples equal to each other per area of their cross sections; and the average of the coefficient of linear thermal expansions within the range of 100° C. to 200° C. is defined as the coefficient of linear thermal expansion (C.T.E.).

Figure 2:
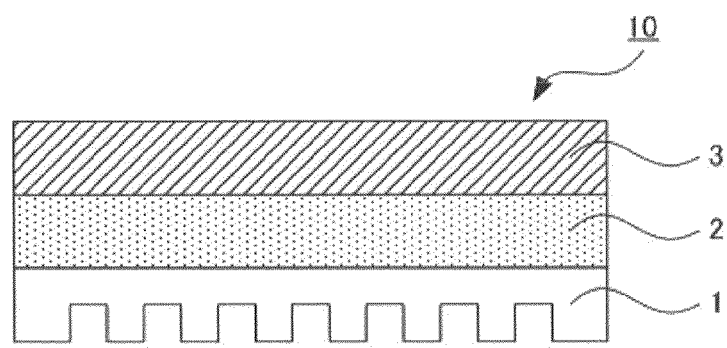
FIG. 2 is a schematic sectional view illustrating another example of the heat dissipating substrate of the invention.

The shape or form of the support base material used in the invention is not particularly limited, and may be, for example, a foil piece form or a plate form, or may be a shape illustrated in FIG. 2, about which a sectional shape of a support base material 1 has irregularities in its surface which contacts the air.

When the support base material has irregularities in its surface which contacts the air, the support base material becomes good in thermal diffusion to be improved in heat dissipating performance. Examples of the method for forming the irregularities include a method of directly conducting a working, such as embossing, etching, sandblasting, frosting, or stamping working on the surface of the support base material, a method of using, for example, a photoresist to form an irregularity pattern, a plating method, and a method of causing a foil-piece-form support base material to adhere onto a support base material having, in its surface, irregularities. In the case of embossing working, for example, a rolling roll having, in its surface, irregularities may be used. In the case of etching working, a chemical is selected in accordance with the species of the support base material. In the case of the method of causing a foil-piece-form support base material to adhere onto a support base material having, in its surface, irregularities, the support base materials can be bonded to each other through, for example, brazing, welding or soldering, or the support base materials can be caused to adhere onto each other through an adhesive such as epoxy resin. In this case, the foil-piece-form support base material and the support base material having, in its surface, irregularities may be made of the same metal material, or made of different metal materials.

From the viewpoint of costs, embossing and etching workings are preferably used.

Incidentally, in FIG. 2, reference numbers represent the same members in FIG. 1, respectively; thus, description thereof is not repeated here.

The size and the shape of the irregularities of cross sections of the support base material are not particularly limited as far as the size and the shape permit the support base material surface contacting the air to be rough and make it possible to increase the surface area. The width, the height, the pitch and other factors of the irregularities are appropriately selected in accordance with the species of the support base material, the use purpose of the invention, and others. By, for example, a simulation, ranges of these factors that are preferred for thermal conduction can be gained.

When viewed in plan, the shape of the support base material used in the invention is not particularly limited as far as the shape makes it possible to cause the support base material to exhibit a desired heat dissipating performance. Usually, the shape is a shape including the entire region where the insulating layer is formed. As far as the heat dissipating performance is not largely lowered, the shape can be optionally rendered such a shape that the region where the insulating layer is formed has therein an opening.

In the invention, it is preferred that the insulating layer and the wiring layer are each independently patterned. In this case, their unnecessary metal foil portions are removed so that the heat dissipating substrate can be made light.

Incidentally, when the support base material is formed on the entire surfaces of the heat dissipating substrate of the invention of the insulating layer, advantages are produced that gas barrier performance against oxygen and water vapor is given to the heat dissipating substrate and further the substrate can be heightened in heat dissipating performance.

The thickness of the support base material used in the invention is not particularly limited as far as the thickness permits the support base material to have thermoconductivity. The thickness is appropriately selected in accordance with the use purpose of the heat dissipating substrate of the invention. As the thickness of the support base material is larger, heat diffraction is made better in the plane direction. Specifically, by making the heat capacity of the support base material larger, local heat can be more easily diffused at its moieties contacting with an electronic element, so that the highest temperature of the moiety is lowered. Thus, the electronic element is prevented from being damaged so that the support base material can be improved in heat dissipating performance.

When the invention is used for an electronic element large in generated-heat-quantity, it is advisable that the thickness is a thickness making it possible to exhibit a particularly good heat dissipating performance. Specifically, the thickness is preferably 70 μm or more. When the thickness is in this range, the support base material can have an excellent heat dissipating performance.

Contrarily, when the support base material is thinner, the support base material is richer in flexibility. When the heat dissipating substrate of the invention has, for example, flexibility, it is advisable that the thickness makes it possible to cause the support base material to have both of thermoconductivity and flexibility.

Specifically, the thickness ranges preferably from 1 μm to 1000 μm, more preferably from 5 μm to 300 μm, and even more preferably from 15 μm to 150 μm. If the support base material is too thin, the support base material cannot exhibit a heat dissipating function sufficiently, or is lowered in gas barrier performance against water vapor. If the support base material is too thick, the support base material is lowered in flexibility and increased in weight and cost.

The support base material should be preferably made thick to prevent the support base material from being broken or deformed, and make the support base material large in heat capacity to relieve a rise in the temperature of the electronic element. When the electronic element is particularly an element about which an electric current is repeatedly turned on and off and the period when the electric current is in an on-state is short, that is, the heat-generating period is short, a rise in the temperature of the electronic element can be effectively restrained. In the invention, from such a viewpoint, the thickness ranges preferably from 70 μm to 10 mm, more preferably from 150 μm to 5 mm, and in particular preferably from 500 μm to 5 mm. When the thickness of the support base material is in this range, a deformation-preventing performance and a temperature-rise-restraining performance as described above can be made particularly good. Moreover, the support base material can be rendered a support base material which rarely undergoes breakage, deformation and other damages.

Specifically, when the material constituting the support base material is copper, the thickness ranges preferably from 5 μm to 2 mm, and in particular preferably from about 5 μm to 200 μm. If the thickness is large, costs are increased.

When the material is aluminum, the thickness ranges preferably from about 100 μm to several millimeters. If the thickness thereof is small, a foil piece thereof becomes short in rigidity. When the material is silicon or graphite, the thickness ranges preferably from about 100 μm to several millimeters. If the thickness thereof is small, the material may be unfavorably cracked by the weight of the material itself.

The heat capacity per unit area (unit: $J/cm^2 \cdot K$) of the support base material is not particularly limited as far as the heat capacity can cause the support base material to exhibit a desired heat dissipating performance. The heat capacity is preferably 0.02 $J/cm^2 \cdot K$ or more, more preferably 0.05 $J/cm^2 \cdot K$ or more, and in particular preferably 0.1 $J/cm^2 \cdot K$ or more. This case makes it possible to restrain a rise in the temperature of the electronic element effectively in a case where the period when an electric current flows into the electronic element, that is, the heat-generating period is short, or in a case where a heat sink is not easily set up owing to a space. However, this is not applied to a case where a rise in the temperature of the support base material can be restrained, such as a case where heat on the support base material is effectively conducted to the outside via the heat sink.

Incidentally, the heat capacity per unit area (unit: $J/cm^2 \cdot K$) of any base plate per unit area thereof is a value obtained by multiplying the specific heat (unit: $J/g \cdot K$) by the density (unit: $g/cm^3$) and the thickness (unit: cm) of the base. Specifically, when the material constituting the support base material is aluminum, the heat capacity is 0.023 $J/cm^2 \cdot K$ in the case of a thickness of 100 μm. When the constituting material is copper, the heat capacity is 0.051 $J/cm^2 \cdot K$ and 0.34 $J/cm^2 \cdot K$ in respective cases of thicknesses of 150 μm and 1000 μm.

As the upper limit thereof is larger, the limit is more preferred to restrain a rise in the temperature of the electronic element. The upper limit is not particularly limited. Usually, the upper limit is appropriately set in accordance with the species, and the weight of the heat dissipating substrate of the invention, a flexibility which the substrate requires, and others.

The support base material used in the invention may be optionally subjected to a surface treatment, or some other treatment.

The surface treatment may be, for example, chemical liquid treatment or plasma treatment.

When the support base material used in the invention is a laminated body and the laminated body has, on the insulating layer side surface thereof, an adhesiveness layer for improving the adhesiveness of the base onto the insulating layer, the adhesiveness layer is not particularly limited as far as the layer has a thermoconductivity as described above and can improve the adhesiveness onto the insulating layer. The adhesiveness layer may be made of a thermoconductive material as described above.

In the invention, the adhesiveness layer is preferably made of chromium, titanium, aluminum, silicon, silicon oxide, silicon nitride, silicon oxynitride, aluminum oxide, aluminum nitride, aluminum oxynitride, chromium oxide, titanium oxide or the like. This adhesiveness layer can effectively improve the adhesiveness onto the insulating layer. The thickness thereof can be set into the range of, for example, 1 nm to 1000 nm. When the adhesiveness layer is comparatively smaller in thermal conductivity than the material that mainly constitutes the support base material in the invention, the thickness is preferably from 1 nm to 500 nm, and more preferably from 1 nm to 100 nm.

The method for forming the support base material used in the invention may be an ordinarily used method, and is appropriately selected in accordance with the species of the material, the thickness of the support base material, and others. The method may be, for example, a method of obtaining the support base material alone, or a method of vapor-depositing the material onto the insulating layer to yield a laminated body composed of the support base material and the insulating layer. Among these methods, the method of obtaining the support base material alone is preferred from the viewpoint of gas barrier performance. In a case where a metal material is used as the material in the method of obtaining the support base material alone, and the support base material is a metal foil piece, the metal foil piece may be a rolled foil piece, or an electrolyzed foil piece. The rolled foil piece is preferred since the rolled foil piece is good in gas barrier performance.

When the support base material is a patterned base, the method for patterning the support base material may be a photolithographic method, or a directly working method using a laser or punching. The photolithographic method is, for example, a method of laminating a dry film resist on the support base material in the state that the support base material and the insulating layer is a laminated body, patterning the dry film resist, etching the support base material along the pattern, and then removing the dry film resist.

3. Wiring Layer

The wiring layer used in the invention is a layer formed directly on the insulating layer, and can be electrically connected to an electronic element arranged on the heat dissipating substrate of the invention. The layer usually contains an electroconductive layer made of an electroconductive material.

The material, which constitutes the electroconductive layer used in the wiring layer in the invention, is not particularly limited as far as the material is an electroconductive material, and is appropriately selected in accordance with whether or not the material has transparency, and other factors. Examples thereof include single metals, such as Al, Au, Ta, W, Pt, Ni, Pd, Cr, Cu, Mo, alkali metals, and alkaline earth metals; respective oxides of these metals; and alloys, such as Al alloys such as AlLi, AlCa and AlMg, Mg alloys such as MgAg, Ni alloys, Cr alloys, alkali metal alloys, and alkaline earth metal alloys. The electroconductive materials may be used alone, in any combination of two or more thereof, and in the form of a laminated body formed by use of two or more thereof. An electroconductive oxide may be used, examples thereof including indium tin oxide (ITO), indium zinc oxide (IZO), tin oxide, zinc oxide, indium oxide, and aluminum zinc oxide (AZO).

In the invention, the electric resistivity is preferably $1.0 \times 10^{-6}$ $\Omega \cdot m$ or less, more preferably $1.0 \times 10^{-7}$ $\Omega \cdot m$ or less, and in particular preferably $3.0 \times 10^{-8}$ $\Omega \cdot m$ or less. When a large current is caused to flow thereinto, this case remarkably produces an advantage of restraining a loss thereof and further generated heat can be reduced.

The thickness of the wiring layer used in the invention may be appropriately set in accordance with the use purpose of the heat dissipating substrate of the invention and other factors.

A location where the wiring layer used in the invention is formed is appropriately set in accordance with the use purpose of the heat dissipating substrate of the invention, and others. The wiring layer is preferably a layer patterned independently of the support base material and the insulating layer. This case makes it possible to render the wiring layer a wiring having a desired pattern.

The wiring layer used in the invention is a layer including an electroconductive layer made of an electroconductive material as described above, and may optionally have, on the insulating layer side surface thereof, an adhesion layer for improving adhesiveness between the wiring layer and the insulating layer, or may have, on the surface thereof on which an electric element is to be arranged, a protective layer, such as a plating layer, for preventing the oxidization, deterioration or other damages of the wiring layer.

The adhesion layer used in the invention is not particularly limited as far as the layer is a layer capable of improving adhesiveness between the insulating layer and the wiring layer. The adhesion layer may be made equivalent to the adhesiveness layer used for the support base material.

Examples of the plating layer include tin, nickel, silver and gold plating layers. As an underlaid layer for the gold plating layer, a nickel plating layer may be formed. The thickness of the plating layer can be adjusted into the range of 0.01 μm to 4.0 μm.

The method for forming the wiring layer used in the invention is not particularly limited as far as the method is a method capable of forming the wiring layer directly onto the insulating layer. When the method is a method of laying a metal layer onto the insulating layer by a metallizing method, conditions therefor are not particularly limited. Any one of vapor deposition, sputtering and plating methods may be used. Two or more of these methods may be used in combination. Specifically, when the wiring layer includes the above-mentioned adhesion layer, the method may be a method of forming this adhesion layer as a layer made of an inorganic material on the insulating layer by sputtering or some other, and then forming the above-mentioned electroconductive layer thereon by vapor deposition or some other.

When a copper foil piece or the like is used as the wiring layer, the method may be a method of forming the insulating layer onto the copper foil piece by applying or some other, and forming plating or the like onto the side of the resultant which is to be a support base material.

The method for forming the wiring layer into a pattern form may be any ordinary method. Examples thereof include a method of vapor-depositing, through an interposed mask, an electroconductive material as describe above, and a method of forming the wiring layer and then using a resist to etch the layer.

4. Heat Dissipating Substrate

The heat dissipating substrate used in the invention is a substrate having at least the above-mentioned support base material, insulating layer, and wiring layer.

In the invention, the heat dissipating substrate may optionally include a thermal conducting section, a sealing member, a cooling section and others.

Examples of an article in which the invention is used include heat-dissipating wiring boards on each of which an electronic element can be mounted which exhibits a desired function to generate heat, whereby the element itself or a member in the vicinity thereof may be deteriorated. In particular, the heat dissipating substrate is preferably used for a wiring board on which an electric element large in generated-heat-quantity is mounted, that is, an element having an electric element large in generated-heat-quantity.

The heat dissipating substrate is usable in an article on which no electronic element is mounted, for example, a large-current board in which a large quantity of an electric current flows in a wiring layer so that a large quantity of heat is generated from the wiring layer.

B. Element

The following will describe the element of the invention.

The element of the invention comprises the above-mentioned heat dissipating substrate, and an electronic element arranged on the wiring layer of the heat dissipating substrate.

Figure 3:
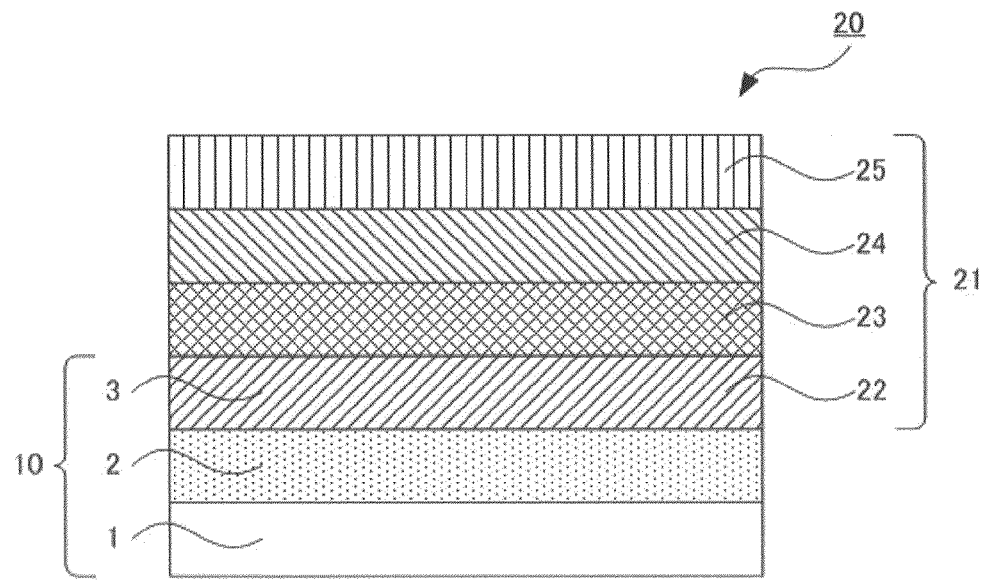
FIG. 3 is a schematic sectional view illustrating an example of the element of the invention.

Referring to the drawings, the element of the invention is described. FIG. 3 is a schematic sectional view illustrating an example of the element of the invention. As illustrated in FIG. 3, in an element 20 of the invention, an electronic element 21 is arranged on the wiring layer 3 of the above-mentioned heat dissipating substrate 10.

Incidentally, this example has the following as the electronic element 21: an organic EL element in which the wiring layer 3 is used as a rear electrode layer 22 and thereon are laminated an EL layer 23 containing a light emitting layer, a transparent electrode layer 24, and a transparent substrate 25 in this order. The reference numbers in FIG. 3 represent the same members as in FIG. 1, respectively. Thus, a description thereof is not repeated here.

According to the invention, the element can be made excellent in heat dissipating performance since the above-mentioned heat dissipating substrate is used. Accordingly, the element can attain a reduction in deterioration of the electronic element, and any member in the vicinity of the element. Moreover, the element can make the heat dissipating substrate neither peel nor short circuit.

The element of the invention comprises at least the above-mentioned heat dissipating substrate and an electronic element.

Hereinafter, each of the constituents of the element of the invention will be described in detail.

Incidentally, the contents of the heat dissipating substrate are identical with those described in above-mentioned item "A. heat dissipating substrate"; thus, a description thereof is not repeated here.

1. Electronic Element

The electronic element used in the invention is an element generating a large quantity of heat when the element exhibits a desired function, and is an element to which a heat dissipating function needs to be given. Specific examples thereof include an LED element, an EL element, an organic thin film solar cell, a solid-state image sensor, a power semiconductor, and other semiconductor elements.

Incidentally, such electronic elements are identical with ordinarily used electronic elements; thus, a description thereof is not repeated here.

For example, the EL element may be an element having at least a transparent substrate, a transparent electrode layer, an EL layer containing at least a light emitting layer, and a rear electrode layer.

2. Element

The element of the invention comprises the above-mentioned heat dissipating substrate, and an electronic element arranged on the heat dissipating substrate.

The wiring layer of the heat dissipating substrate can be rendered a layer used as a part of an electrode layer contained in the electronic element. When the electronic element is, for example, an EL element, the wiring layer of the heat dissipating substrate can be rendered a layer used as a rear electrode layer.

The method for producing the element of the invention is not particularly limited as far as the method is a method capable of causing the individual constituents of the element to adhere closely to each other with a high precision. The method may be, for example, a method of laminating the individual constituents of the electronic element onto the wiring layer of the heat dissipating substrate, or a method of forming the heat dissipating substrate and the electronic element independently, and then laminating the two onto each other.

Incidentally the invention is not limited into the above-mentioned embodiments. The embodiments are exemplary, and any embodiment that has substantially the same structure and produces substantially the same effects and advantages as technical subject matters recited in the claims of the invention is included in the technical scope of the invention.

EXAMPLES

Hereinafter, the invention will be specifically described by using Examples thereof, and Comparative Examples.

1. Preparation of Insulating-Layer-Forming Resin Solution

(1) Production Example 1

4.0 g (20 mmol) of 4,4'-diaminodiphenyl ether (ODA), and 8.65 (80 mmol) g of p-phenylenediamine (PPD) were charged into a 500-mL separable flask, and these components were dissolved in 200 g of dehydrated N-methyl-2-pyrrolidone (NMP). Under nitrogen gas flow, this reaction system was stirred while heated in an oil bath in the state that the liquid temperature was monitored with a thermocouple so as to be 50° C. It was verified that these components were completely dissolved, and subsequently thereto was bit by bit added 29.1 g (99 mmol) of 3,3',4,4'-biphenyltetracarboxylic dianhydrate (BPDA) over 30 minutes. After the end of the addition, the system was stirred at 50° C. for 5 hours. Thereafter, the system was cooled to room temperature to yield a polyimide precursor solution 1.

(2) Production Example 2

Polyimide precursor solutions 2 to 18 were each synthesized using a blend ratio shown in Table 1 described below in the same way as in Production Example 1 except that the reaction temperature was adjusted and the amount of NMP was adjusted to set the concentration of the solution into the range of 17 to 19% by weight.

The acid dianhydrate used therein was 3,3',4,4'-biphenyltetracarboxylic dianhydrate (BPDA), pyromellitic dianhydride (PMDA), p-phenylenebistrimellitic acid monoester dianhydride (TAHQ), or p-biphenylenebistrimellitic acid monoester dianhydride (BPTME). The diamine(s) used therein was/were one or two out of 4,4'-diaminodiphenyl ether (ODA), 3,4'-diaminodiphenyl ether (3,4'-ODA), p-phenylenediamine (PPD), 1,4-bis(4-aminophenoxy)benzene (4APB), 2,2'-dimethyl-4,4'-diaminobiphenyl (TBHG), 2,2'-bis(trifluoromethyl)-4,4'-diaminobiphenyl (TFMB), and 3,4'-diaminodiphenyl ether (3,4'-ODA).

(3) Production Example 3

Photosensitive polyimides 1 to 4 were each prepared by adding, to the polyimide precursor solutions 1 and 11, DNCDP ({[(4,5-dimethoxy-2-nitrobenzyl)oxy]carbonyl}-2,6-dimethylpiperidine) or an optical base generator 4MeOC-Pi illustrated below as an additive to give a blend ratio shown in Table 2 described below.

Incidentally the blend amount of the additive in Table 2 shows parts by weight for 100 parts by weight of each of the polyimide precursor solution.

[Chemical Formula 8]

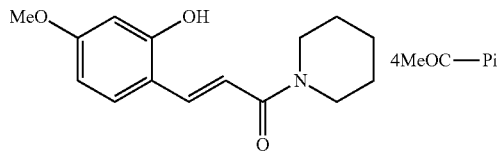

4MeOC—Pi (4) Others

Additionally, as comparative polyimide precursor solutions 1 to 3, the following were prepared: EN-20™ (comparative polyimide precursor solutions 1), SN-20™ (comparative polyimide precursor solutions 2), and PN-20™ (comparative polyimide precursor solutions 3), which are manufactured by New Japan Chemical Co., Ltd.

Prepared was also a solution (comparative epoxy resin solution) in which 19 g of a bisphenol A type epoxy resin EPICLON 850S™ (manufactured by DIC Corp.; epoxy equivalent: 183-193) was mixed with 2.9 g of hexanediamine.

TABLE 2

| | Polyimide precursor solution | Additive | Additive blend amount |
|---|---|---|---|
| Photosensitive polyimide 1 | Polyimide precursor solution 1 | DNCDP | 15 |
| Photosensitive polyimide 2 | Polyimide precursor solution 1 | 4MeOC-Pi | 10 |
| Photosensitive polyimide 3 | Polyimide precursor solution 11 | 4MeOC-Pi | 15 |
| Photosensitive polyimide 4 | Polyimide precursor solution 11 | DNCDP | 15 |

2. Evaluation of Coefficient of Linear Thermal Expansions and Coefficient of Hygroscopic Expansions The polyimide precursor solutions 1 to 18, the comparative polyimide precursor solutions 1 to 3, and the photosensitive polyimides 1 to 4 were each applied onto a heat-resistant film (UPILEX S 50S™, manufactured by Ube Industries, Ltd.) caused to adhere onto a glass piece, and the resultant was dried on a hot plate of 80° C. for 10 minutes. Thereafter, the dried matter was peeled off from the heat-resistant film to yield a film having a thickness from 15 μm to 20 μm. The film was then fixed onto a frame made of a metal, and the resultant was subjected to heat treatment at 350° C. (temperature-raising rate: 10° C./minute) in nitrogen atmosphere for 1 hour (followed by natural cooling). In this way, respective films of polyimide resins 1 to 25 each having a thickness from 9 μm to 15 μm were yielded.

The comparative epoxy resin solution was applied onto a heat-resistant film (UPILEX S 50S™, manufactured by Ube Industries, Ltd.) caused to adhere onto a glass piece, and the resultant was dried in an oven of 80° C. for 60 minutes. Thereafter, the dried matter was peeled off from the heat-resistant film to yield a film (epoxy film 1) having a thickness of 55 μm.

(a) Coefficient of Linear Thermal Expansion

Each of the films produced by the above-mentioned methods was cut into each piece of a size of 5 mm width×20 mm length. The piece was used as an evaluating sample. The coefficient of linear thermal expansion thereof was measured

TABLE 1

| | Acid dihydride | | Diamine | | Diamine | | |
|---|---|---|---|---|---|---|---|
| Polyimide precursor solution | Species | Added amount (mmol) | Species | Added amount (mmol) | Species | Added amount (mmol) | Reaction time |
| Polyimide precursor solution 1 | BPDA | 99 | PPD | 80 | ODA | 20 | 50 |
| Polyimide precursor solution 2 | BPDA | 99 | PPD | 100 | — | — | 50 |
| Polyimide precursor solution 3 | BPDA | 99 | — | — | ODA | 100 | 50 |
| Polyimide precursor solution 4 | BPDA | 99 | PPD | 80 | 4APB | 20 | 50 |
| Polyimide precursor solution 5 | BPDA | 99 | — | — | TBHG | 100 | 50 |
| Polyimide precursor solution 6 | BPDA | 99 | ODA | 20 | TBHG | 80 | 50 |
| Polyimide precursor solution 7 | BPDA | 99 | ODA | 25 | TBHG | 75 | 50 |
| Polyimide precursor solution 8 | BPDA | 99 | — | — | TFMB | 100 | 50 |
| Polyimide precursor solution 9 | BPDA | 99 | PPD | 80 | TFMB | 20 | 50 |
| Polyimide precursor solution 10 | BPDA | 99 | PPD | 70 | TFMB | 30 | 50 |
| Polyimide precursor solution 11 | BPDA | 99 | TBHG | 50 | TFMB | 50 | 50 |
| Polyimide precursor solution 12 | PMDA | 99 | — | — | TBHG | 100 | 0 |
| Polyimide precursor solution 13 | PMDA | 99 | — | — | ODA | 100 | 0 |
| Polyimide precursor solution 14 | PMDA | 99 | PPD | 50 | ODA | 50 | 0 |
| Polyimide precursor solution 15 | BPTME | 99 | — | — | ODA | 100 | 50 |
| Polyimide precursor solution 16 | TAHQ | 99 | — | — | ODA | 100 | 50 |
| Polyimide precursor solution 17 | TAHQ | 99 | PPD | 75 | ODA | 25 | 50 |
| Polyimide precursor solution 18 | BPDA | 99 | 3,4'-ODA | 100 | — | — | 50 |
| Comprative Polyimide precursor solution 1 | EN-20 ™(manufactured by New Japan Chemical Co., Ltd.) | | | | | | |
| Comprative Polyimide precursor solution 2 | SN-20 ™(manufactured by New Japan Chemical Co., Ltd.) | | | | | | |
| Comprative Polyimide precursor solution 3 | PN-20 ™(manufactured by New Japan Chemical Co., Ltd.) | | | | | | | by means of a thermomechanical analyzer, Thermo Plus TMA 8310™ (manufactured by Rigaku Corp.)). Conditions for the measurement were as follows: each of the evaluating samples was adjusted into an observation length of 15 mm; the temperature-raising rate was set to 10° C./minute; and the tension load was set to 1 g/25000-μm² to make loads onto the evaluating samples equal to each other per area of their cross sections; and the average of the coefficient of linear thermal expansions within the range of 100° C. to 200° C. was defined as the coefficient of linear thermal expansion (C.T.E.). The evaluation results are shown in Table 3.

(b) Coefficient of Hygroscopic Expansion

Each of the films produced by the above-mentioned methods was cut into a piece of a size of 5 mm width×20 mm length. The piece was used as an evaluating sample. The coefficient of hygroscopic expansion thereof was measured by means of a humidity-variable mechanical analyzer, Thermo Plus TMA 8310™ modified (manufactured by Rigaku Corp.)). The temperature was set to a constant temperature of 25° C., and the sample was first made stable in an environment having a humidity of 15% RH. This state was kept for about 30 minutes to 2 hours, and then the humidity of its measuring moiety was adjusted to 20% RH. Furthermore, this state was kept for about 30 minutes to 2 hours until the sample became stable. Thereafter, the humidity was changed to 50% RH. The difference in sample-length between the sample made stable at this humidity and the sample made stable at 20% RH was divided by the change in the humidity (in this case, 50−20=30). The resultant value was divided by the sample length. The resultant value was defined as the coefficient of hygroscopic expansion (C.H.E.). In the measurement, the tension load was set to 1 g/25000-μm² to make loads onto the evaluating samples equal to each other per area of their cross sections. The evaluation results are shown in Table 3.

(c) Substrate Warp Evaluation

Polyimide films 1 to 25 were each formed onto an electrolyzed copper foil piece (manufactured by Nikko Materials Co., Ltd.) (support base material) of 18 μm thickness through the same process as used for producing the samples for the coefficient of linear thermal expansion evaluation under the sample conditions as used therefor, so as to set the film thickness after the imidization to 10 μm ±1 μm, using one of the polyimide precursor solutions 1 to 18, the comparative polyimide precursor solutions 1 to 3, and the photosensitive polyimides 1 to 4. Thereafter, the resultant laminated body composed of the copper piece and the polyimide film was cut into each piece having a size of 10 mm width and 50 mm length. The resultant pieces were used as samples for substrate warp evaluation.

About one of the samples, only one of the short sides thereof was fixed onto a surface of a SUS plate as a measuring tool through a KAPTON tape, and this unified body was heated in an oven of 100° C. for 1 hour. In the oven heated to 100° C., a measurement was made about the distance of a rise of the reverse-side short side of the sample from the SUS plate. When the distance was from 0 mm to 0.5 mm both inclusive, the sample was judged to be good (○); when the distance was more than 0.5 mm and 1.0 mm or less, the sample to be fair (Δ); and when the distance was more than 1.0 mm, the sample to be improper (X).

In the same manner, about the samples, only one of the short sides thereof was fixed onto a surface of a SUS plate through a KAPTON tape, and this unified body was allowed to stand still at 23° C. and 85% RH in a constant temperature & moisture chamber for 1 hour. A measurement was made about the distance of a rise of the reverse-side short side of the sample from the SUS plate. When the distance was from 0 mm to 0.5 mm both inclusive, the sample was fudged to good (○); when the distance was more than 0.5 mm and 1.0 mm or less, the sample to be fair (Δ); and when the distance was more than 1.0 mm, the sample to be improper (X). The evaluation results are shown in Table 3.

(d) Storage Elastic Modulus

Each of the polyimide films produced by the above-mentioned methods was cut into each piece of a size of 5 mm width and 20 mm length. The piece was used as a evaluating sample. The storage elastic modulus thereof was measured with an instrument RSA3™ (manufactured by TA Instruments Japan Inc.). About conditions for the measurement, the evaluating sample was adjusted into an observation length of 15 mm, the temperature-raising rate was 5° C./minute, the measuring frequency was set to 1 Hz, and the measuring temperature range was set into the range of 0° C. to 400° C. In Table 3 is shown a minimum value out of the storage elastic moduli in the range of room temperature (25° C.) to 250° C., as well as the same value in that of room to 300° C. About any one that had a glass transition temperature (Tg) lower than 280° C. out of the samples, shown is a minimum value out of the storage elastic moduli in the temperature range of room temperature to "glass transition temperature +20° C.

(e) Glass Transition Temperature (Tg)

In connection with the above-mentioned storage elastic modulus measurement, the top of a peak of the tan δ, which is a value obtained by dividing the loss elastic modulus by the storage elastic modulus thereof, was defined as the glass transition temperature. The evaluation results are shown in Table 3.

(f) Dielectric Breakdown Voltage Measurement

The polyimide film 1 (thickness: 20 μm) produced by the above-mentioned method was used, and the dielectric breakdown voltage thereof was measured, using a withstand voltage tester PM55ADZ™ (manufactured by Takasago Ltd.) and a digital microscope KH-7700™ (manufactured by Hirox Co., Ltd.). As a result, the voltage was 6.0 kV.

The epoxy film 1 (thickness: 100 μm) produced by the above-mentioned method was used, and the dielectric breakdown voltage thereof was measured. As a result, the voltage was 7.0 kV.

(g) Volume Resistivity Measurement

The polyimide precursor solution 1 was coated onto a copper base (manufactured by Furukawa Electric Co., Ltd.) cut into a piece of 10 cm square and having a thickness of 150 μm with a spin coater to have a thickness of 6 μm after the applied solution was cured. The resultant was dried onto a hot plate of 100° C. for 10 minutes. Thereafter, in nitrogen atmosphere, the dried matter was subjected to heat treatment at 350° C. (temperature-raising rate: 10° C./minute) for 1 hour (followed by natural cooling). In this way, a sample 1 for volume resistivity measurement was produced in which an insulating layer was formed.

Using instruments Hiresta UP MCP-HT, 450 type, and MCP-JB03 type (manufactured by Mitsubishi Chemical Corp.), the volume resistivity of the sample 1 for volume resistivity measurement was measured by a method according to JIS-K6911 at an applied DC voltage of 250 V. As a result, the volume resistivity was $3.4 \times 10^{14}$ Ω·m.

The comparative epoxy resin solution was coated onto a copper base (manufactured by Furukawa Electric Co., Ltd.) cut into a piece of 10 cm square and having a thickness of 150 μm with a spin coater to have a thickness of 100 μm after the coated solution was cured. In an oven of 80° C., the resultant was heated in the atmosphere for 60 minutes to form a comparative sample 1 for volume resistivity measurement, in which an insulating layer was formed.

Using instruments Hiresta UP MCP-HT, 450 type, and MCP-JB03 (manufactured by Mitsubishi Chemical Corp.), the volume resistivity of the comparative sample 1 for volume resistivity measurement, which was produced by the above-mentioned method, was measured by the method according to JIS-K6911 at an applied DC voltage of 250 V. As a result, the volume resistivity was $3.6 \times 10^{12}$ Ω·m.

It has been made clear from the above that by making the insulating layer thinner, the heat dissipating performance thereof is made higher.

The polyimide precursor solution 1 was coated onto each aluminum base (A5052 H34™, commercially available from Mansei Kogyo Co.) cut into a piece of 5 cm square and having a thickness of 1000 μm by spin coating. The resultant was dried on a hot plate of 100° C. for 15 minutes, and subjected to heat treatment at 350° C. in nitrogen atmosphere for 1 hour.

TABLE 3

| Polyimide film | Polyimide precursor solution | coefficient of liner thermal expansion (ppm/° C.) | coefficient of hygroscopic expansion (ppm/% RH) | Substrate warp evaluation 100° C. | Substrate warp evaluation 85% RH | Storage elastic modulus <250° C. | Storage elastic modulus <300° C. | Storage elastic modulus < Tg + 20° C. | Tg |
|---|---|---|---|---|---|---|---|---|---|
| 1 | Polyimide precursor solution 1 | 18.9 | 8.4 | ○ | ○ | $5.4 \times 10^9$ | $2.4 \times 10^9$ | — | 313 |
| 2 | Polyimide precursor solution 2 | 10.9 | 8.5 | ○ | ○ | $1.6 \times 10^9$ | $1.3 \times 10^9$ | — | 372 |
| 3 | Polyimide precursor solution 3 | 43.9 | 21.8 | X | X | $2.1 \times 10^9$ | $1.3 \times 10^8$ | — | 285 |
| 4 | Polyimide precursor solution 4 | 19.3 | 10.9 | ○ | ○ | $3.3 \times 10^9$ | $1.3 \times 10^9$ | — | 289 |
| 5 | Polyimide precursor solution 5 | 4.6 | 5.1 | Δ | ○ | $2.1 \times 10^9$ | $2.0 \times 10^9$ | — | >400 |
| 6 | Polyimide precursor solution 6 | 12.3 | 6.1 | ○ | ○ | $1.5 \times 10^9$ | $1.1 \times 10^9$ | — | >400 |
| 7 | Polyimide precursor solution 7 | 22.0 | 8.7 | ○ | ○ | $2.1 \times 10^9$ | $1.5 \times 10^9$ | — | 397 |
| 8 | Polyimide precursor solution 8 | 31.1 | 3.5 | X | ○ | $1.5 \times 10^9$ | $5.8 \times 10^9$ | — | >400 |
| 9 | Polyimide precursor solution 9 | 11.4 | 5.9 | ○ | ○ | — | — | — | — |
| 10 | Polyimide precursor solution 10 | 15.4 | 3.4 | ○ | ○ | — | — | — | — |
| 11 | Polyimide precursor solution 11 | 10.8 | 6.7 | ○ | ○ | $2.8 \times 10^9$ | $1.0 \times 10^9$ | — | >400 |
| 12 | Polyimide precursor solution 12 | 14.2 | 3.8 | ○ | ○ | $2.0 \times 10^9$ | $1.8 \times 10^9$ | — | >400 |
| 13 | Polyimide precursor solution 13 | 35.2 | 20.4 | X | Δ | $2.1 \times 10^9$ | $1.9 \times 10^9$ | — | >400 |
| 14 | Polyimide precursor solution 14 | 17.2 | 21.6 | ○ | X | $1.9 \times 10^9$ | $1.8 \times 10^9$ | — | 385 |
| 15 | Polyimide precursor solution 15 | 34.7 | 4.0 | X | ○ | $5.8 \times 10^8$ | $4.6 \times 10^8$ | — | >400 |
| 16 | Polyimide precursor solution 16 | 37.7 | 6.5 | X | ○ | $8.9 \times 10^8$ | $7.0 \times 10^8$ | — | 375 |
| 17 | Polyimide precursor solution 17 | 15.6 | 9.7 | ○ | ○ | $1.8 \times 10^9$ | $1.8 \times 10^9$ | — | >400 |
| 18 | Polyimide precursor solution 18 | 55.9 | 17.7 | X | Δ | $1.2 \times 10^9$ | $2.6 \times 10^8$ | $2.7 \times 10^8$ | 279 |
| 19 | Comparative polyimide precursor solution 1 | 71.5 | — | X | — | $2.4 \times 10^5$ | $2.4 \times 10^5$ | $2.0 \times 10^6$ | 195 |
| 20 | Comparative polyimide precursor solution 2 | 52.4 | — | X | — | $1.2 \times 10^9$ | $7.5 \times 10^7$ | — | 302 |
| 21 | Comparative polyimide precursor solution 3 | 59.9 | — | X | — | $1.4 \times 10^9$ | $5.1 \times 10^6$ | $8.1 \times 10^8$ | 275 |
| 22 | Photosensitive polyimide 1 | 26.1 | 16.0 | Δ | Δ | — | — | — | — |
| 23 | Photosensitive polyimide 2 | 22.1 | 13.0 | ○ | ○ | — | — | — | — |
| 24 | Photosensitive polyimide 3 | 15.5 | 8.9 | ○ | ○ | $2.1 \times 10^9$ | $8.6 \times 10^8$ | — | >400 |
| 25 | Photosensitive polyimide 4 | 21.1 | — | ○ | — | $1.9 \times 10^9$ | $7.8 \times 10^8$ | — | >400 |

The coefficient of linear thermal expansion of copper foil is 16.2 ppm/° C. Thus, it has been verified that as the difference in coefficient of linear thermal expansion between a polyimide film and the metal foil piece (support base material) is larger, the present laminated body is more largely warped.

It is understood from Table 3 that as the coefficient of hygroscopic expansion of a polyimide film is smaller, the laminated body is less warped in a high-humidity environment.

(h) Heat Dissipating Performance Evaluation

A non-alkali glass piece NA35™ (manufactured by Avanstrate Inc.; thickness: 0.7 mm) of 50 mm square was heated onto a hot plate of 100° C. to make the surface temperature thereof stable (surface temperature: 90° C. during the heating).

The above-mentioned sample 1 for volume resistivity measurement was put onto a non-alkali glass piece NA35™ having a size of 150 mm length and 100 mm width to locate its insulating layer upward. The above-mentioned heated glass piece of 50 mm square was put onto the insulating layer of the sample. After 5 seconds, the surface temperature of this glass piece was measured. As a result, the temperature was 48° C.

In the same way, the comparative sample 1 for volume resistivity measurement was used to measure the temperature after 5 seconds. As a result, the temperature was 62° C.

In this way, bases for heat dissipating performance evaluation were formed which each had, on the aluminum base, a polyimide layer having a thickness of 1 μm to 85 μm. A prepreg (R-1551XE™ (manufactured by Panasonic Corp.)); 60 μm) was pressed onto the same aluminum base to produce a comparative base for heat dissipating performance evaluation.

A silicone rubber TC-50HSV-1.4™ (manufactured by Shin-Etsu Chemical Co., Ltd.) cut into a piece of 5 mm square was used to fix a micro ceramic heater MS-M5™ (manufactured by Sakaguchi EH Voc Corp.) of 5 mm square onto the center of each of the produced bases on the insulating layer surface side thereof. A device PMC-35-2A™ (manufactured by Kikusui Electronics Corp.) was used to apply an electric power of 1 W to the micro ceramic heater. After 30 minutes elapsed, at which the present system had turned to a stationary state, a silicone rubber TC-100HSV-1.4™ (manufactured by Shin-Etsu Chemical Co., Ltd.) was used to measure the temperature of the center of the surface of the micro ceramic heater with a thermocouple fixed onto the micro ceramic heater. Simultaneously, the temperature of the aluminum base, which was the support base material, was measured, using a contacting-type thermometer HA-302K™ (manufactured by Anritsu Meter Co., Ltd.).

Incidentally the thermometer on the support base material was brought into contact with the support base material to make the central spot of the thermometer consistent with the intermediate spot between the heater center (support base material center) and the support base material (insulating layer) end (side) nearest to the heater center when the two spots were viewed in plan. In this state, the measurement was made.

The results are shown in Table 4 described below.

TABLE 4

| Support base | Insulating layer | Insulating layer film thickness (μm) | Support base temperature (° C.) | Heater temperature (° C.) |
|---|---|---|---|---|
| Aluminum: 1 mm | None | — | 53.1 | 113.3 |
| Aluminum: 1 mm | Polyimide | 4.1 | 48.2 | 114 |
| Aluminum: 1 mm | Polyimide | 7.7 | 46.4 | 118.5 |
| Aluminum: 1 mm | Polyimide | 11 | 46 | 122 |
| Aluminum: 1 mm | Polyimide | 14 | 45.5 | 122.8 |
| Aluminum: 1 mm | Polyimide | 22 | 44.5 | 123.8 |
| Aluminum: 1 mm | Polyimide | 42 | 43.8 | 123.7 |
| Aluminum: 1 mm | Polyimide | 65 | 43.5 | 124 |
| Aluminum: 1 mm | Polyimide | 85 | 43.6 | 123.9 |
| Aluminum: 1 mm | Prepreg | 64 | 42.9 | 123.9 |

From Table 4, it has been made clear that: even when the polyimide film thickness becomes large in a range that the film thickness is 20 μm or more, the substrate temperature and the heater surface temperature are not largely varied; but in a range that the film thickness is 20 μm or less, the substrate temperature is high and the heater surface temperature is low so that the polyimide is excellent in heat dissipating performance. This advantageous effect was remarkable when the polyimide film thickness was particularly in the range of 10 μm or less. Between the insulating layers different from each other in raw material, in accordance with the difference, a remarkable difference was not observed when the layers had a similar thickness.

(i) Dielectric Breakdown Voltage Measurement

The polyimide precursor solution 1 was applied onto each SUS 304 foil piece (manufactured by Toyo Seihaku Kabushiki Kaisha) having a thickness of 18 μm and caused to adhere onto a glass piece, and the resultant was dried on a hot plate of 100° C. for 15 minutes. Thereafter, in nitrogen atmosphere, the dried matters were each subjected to heat treatment at 350° C. for 1 hour to form, on the SUS foil piece, a polyimide layer (insulating layer) having a thickness from 1 μm to 20 μm shown in Table 5 described below.

Next, about any film having a thickness of 5 μm or more, out of the polyimides films, the SUS foil piece was etched to yield a polyimide film. The dielectric breakdown voltage thereof was measured against direct current or alternating current, using a withstand voltage tester PN55ADZ™ (manufactured by Takasago Ltd.) and a digital microscope KH-7700™ (manufactured by Hirox Co., Ltd.). About any film having a thickness of 5 μm or less, out of the polyimides films, the same measurement was made in the form that the polyimide film was formed on the SUS foil piece. The results are shown in Table 5.

TABLE 5

| Insulating layer film thickness (μm) | Measured form | AC (kV) | DC (kV) |
|---|---|---|---|
| 1 | Form on SUS foil piece | 0.16 | 0.04 |
| 3 | Form on SUS foil piece | 0.77 | 1.27 |
| 5 | Form on SUS foil piece | 1.49 | 1.93 |
| 5 | Film | 1.64 | 2.29 |
| 7.5 | Film | 2.37 | 3.17 |
| 10 | Film | 2.60 | 3.47 |
| 12.5 | Film | 2.54 | 4.63 |
| 15 | Film | 3.09 | 4.71 |
| 17.5 | Film | 3.79 | >5 |
| 20 | Film | 3.89 | >5 |

(j) Process Resistance Test (Measuring-Sample Production)

Each aluminum base (A5052 H34™, commercially available from MANSEI KOGYO CO.) having a thickness of 1000 μm and cut into a size of 16 cm square was subjected to electroless plating with Ni to give a plating thickness of 1 μm. In this way, a Ni electroless plated aluminum base was produced.

Each aluminum base (A5052 H34™, commercially available from MANSEI KOGYO CO.) having a thickness of 1000 μm and cut into a size of 16 cm square was subjected, for the formation of a power feeding layer, to electroless plating with Ni followed by electroplating with Ni for giving an electroplating thickness of 1 μm. In this way, Ni electroplated aluminum bases were produced.

(Process Resistance Test)

The plated aluminum bases, and aluminum bases subjected to anodic oxidization treatment, and ones coated with an acrylic clear paint were tested in each process test described below. For comparison, the same tests were applied also to a copper base of 150 μm thickness (manufactured by Furukawa Electric Co., Ltd.) as well as untreated aluminum bases of 1000 μm thickness (A1050 H24™, and A5052 H34™ each commercially available from MANSEI KOGYO CO.). The results are shown in Table 6 described below.

Heat resistance: 350° C. for 1 hour in nitrogen atmosphere (evaluation: ○: unchanged, X: changed)

Alkaline liquid: 2.38% by weight of TMAH (manufactured by Tokyo Ohka Kogyo Co., Ltd.), and 0.1 mol/L of NaOH solution in water (evaluation: based on the period (seconds) required until foam (hydrogen) was generated from each of the treated base surfaces after the treatment)

Acidic liquid: sulfuric acid (volume fraction of 10%), and hydrochloric acid (1 mol/L) (evaluation: based on the period (seconds) required until foam (hydrogen) was generated from each of the treated base surfaces after the treatment)

TABLE 6

| Base | Support base Surface treatment | Heat resistance | Alkali resistance TMAH | NaOH | Acid resistance Sulfuric acid | Hydrochloric acid |
|---|---|---|---|---|---|---|
| Aluminum base (A5052 ™) | Ni plating (electroless plating: 1 μm) | ○ | >1800 | >1800 | >900 | >900 |
| Aluminum base (A5052 ™) | Ni plating (electroless plating followed by electroplating: 1 μm) | ○ | >1800 | >1800 | >900 | 105 |

TABLE 6-continued

| Support base | | Heat | Alkali resistance | | Acid resistance | |
|---|---|---|---|---|---|---|
| Base | Surface treatment | resistance | TMAH | NaOH | Sulfuric acid | Hydrochloric acid |
| Aluminum base (A1050 ™) | Untreated | ○ | 28 | <10 | >900 | Δ |
| Aluminum base (A5052 ™) | Untreated | ○ | 15 | <10 | >900 | Δ |
| Aluminum base (A5052 ™) | Sulfuric acid-anodic oxidization: 5 μm | ○ | 420 | 71 | >900 | >900 |
| Aluminum base (A5052 ™) | Sulfuric acid-anodic oxidization: 10 μm | ○ | 760 | 150 | >900 | >900 |
| Aluminum base (A5052 ™) | Sulfuric acid-anodic oxidization: 25 μm | ○ | 1110 | 360 | >900 | >900 |
| Aluminum base (A5052 ™) | Sulfuric acid-anodic oxidization: 50 μm | ○ | 1560 | 730 | >900 | >900 |
| Aluminum base (A5052 ™) | Acrylic clear paint 10 μm | Yellowed | >1800 | >1800 | >900 | >900 |
| Copper | Untreated | ○ | >1800 | >1800 | >900 | Δ |

Δ: slightly discolored when 900 seconds elapsed.

From Table 6, it has been made clear that when the aluminum base is subjected to Ni plating as well as anodic oxidization treatment in sulfuric acid, the base can be improved in alkali resistance. It has been made clear that Ni plating, particularly, Ni electroplating is effective for improving the base in process resistance.

Example 1

A die coater having a coating width of 150 mm was used to coat the polyimide precursor solution 1 onto an area of 150 mm square of a copper base (manufactured by Furukawa Electric Co., Ltd.) having a thickness of 150 μm and cut into a size of 16 cm square in such a manner that after cured, the coated solution 1 would have a thickness of 10 μm. The workpiece was dried in the atmosphere in an oven of 80° C. for 60 minutes. Thereafter, the workpiece was subjected to heat treatment at 350° C. (temperature-raising rate: 10° C./minute) in nitrogen atmosphere for 1 hour (followed by natural cooling). In this way, a laminated body 1 was produced in which an insulating layer was formed.

Next, a wiring layer was formed onto the insulating layer of the laminated body 1 as follows.

First, the whole of the insulating-layer-formed side of the laminated body was subjected to surface-roughening treatment under conditions described below, and washed with water. Furthermore, a catalyst was given thereto, and electroless plating was applied thereto under conditions described below to form an electroless plating layer having a thickness of 0.3 μm.

<Surface-Roughening Treatment Conditions>
Wet blast machine, manufactured by Macoho Co., Ltd.
Alumina grinding stones; water pressure: 0.7 kg/m²
Treatment speed: 10 m/min
<Electroless Plating Conditions>
Sensitizing: 3 minutes according to S-10X™ (manufactured by C. Uyemura & Co., Ltd.)
Activating: 3 minutes according to A-10X™ (manufactured by C. Uyemura & Co., Ltd.)
Electroless plating: 1 minute according to NPR-4™ (manufactured by C. Uyemura & Co., Ltd.)

Next, a dry film resist (AQ 5038™, manufactured by Asahi Kasei Corporation) was used, and the workpiece was coated with this resist to become 50 μm in thickness, exposed to light, and developed to form a resist layer having openings matched with a wiring layer shape.
<Treatment Conditions>
Prebake: 5 minutes at 120° C.
Exposure: 60 mJ/cm²
Development: 1 minute with a 1% sodium carbonate solution (30° C.)

Next, the upper of the electroless plating layer exposed from the openings in the resist layer was successively subjected to nickel bright electroplating, copper electroplating, dull electroplating, and gold electroplating to lay a wiring layer including an electroplating layer in which a nickel bright electroplating layer, a copper electroplating layer, a dull electroplating layer, and a gold electroplating layer were formed to have thicknesses of 0.2 μm, 10 μm, 0.2 μm and 0.1 μm, respectively.

<Solution Composition and Conditions of Nickel Bright Electroplating>
Nickel sulfate (hexahydrate): 300 g/L
Nickel chloride (hexahydrate): 45 g/L
Boric acid: 40 g/L
PC nickel A-1: 10 mL/L (manufactured by C. Uyemura & Co., Ltd.)
PC nickel A-2: 1 mL/L (manufactured by C. Uyemura & Co., Ltd.)
Temperature: 50° C.
Current density: 1 A/dm²
Period: 1 minute
Copper sulfate plating: formed into a thickness of 10 μm
<Solution Composition and Conditions of Copper Electroplating>
Copper sulfate (pentahydrate): 70 g/L
Sulfuric acid: 200 g/L
Hydrochloric acid: 0.5 mL/L
Brightener: SUPER SLOW 2000™, 10 mL/L
Correcting agent: SUPPER SLOW 2000™, 5 mL/L
Temperature: 30° C.
Current density: 4 A/dm²
Period: 12 minutes
<Ni Dull Electroplating>
WHN plating solution (manufactured by Japan Pure Chemical Co., Ltd.)
Temperature: 50° C.
Current density: 1 A/dm²
Period: 1 minute
<Gold Electroplating>
TEMPERESIST K-91S™ (manufactured by Japan Pure Chemical Co., Ltd.)
Temperature: 60° C.
Current density: 0.4 A/dm²
Period: 1.25 minutes Next, the resist layer was peeled and removed with a 3% solution of sodium hydroxide at 50° C. for 1 minute, and washed. Thereafter, the electroless plating layer 140 made exposed was softly etched with a solution NIMUDEN RIP C-11™ to be peeled off.

Furthermore, in order to remove the catalyst, a wet blasting machine manufactured by Macoho Co., Ltd. was used to treat the workpiece with alumina grinding stones at a water pressure of 0.5 kg/m² and a treating rate of 10 m/min to remove the catalyst. Next, the workpiece was subjected to heat treatment at 180° C. in nitrogen atmosphere for 1 hour to form a wiring layer. In this way, a heat dissipating substrate was produced.

Example 2

A die coater having a coating width of 150 mm was used to coat the polyimide precursor solution 1 onto an area of 150 mm square of a copper base (manufactured by Furukawa Electric Co., Ltd.) having a thickness of 150 μm and cut into a size of 16 cm square in such a manner that after cured, the coated solution 1 would have a thickness of 20 μm. The workpiece was dried in the atmosphere in an oven of 80° C. for 60 minutes. Thereafter, the workpiece was subjected to heat treatment at 350° C. (temperature-raising rate: 10° C./minute) in nitrogen atmosphere for 1 hour (followed by natural cooling). In this way, a laminated body 2 was produced in which an insulating layer was formed.

Next, a wiring layer was formed in the same way as in Example 1 except that the laminated body 2 was used. In this way, a heat dissipating substrate was produced.

Example 3

A die coater having a coating width of 150 mm was used to coat the polyimide precursor solution 1 onto an area of 150 mm square of a copper base (manufactured by Furukawa Electric Co., Ltd.) having a thickness of 150 μm and cut into a size of 16 cm square in such a manner that after cured, the coated solution 1 would have a thickness of 5 μm. The workpiece was dried in the atmosphere in an oven of 80° C. for 60 minutes. Thereafter, the workpiece was subjected to heat treatment at 350° C. (temperature-raising rate: 10° C./minute) in nitrogen atmosphere for 1 hour (followed by natural cooling). In this way, a laminated body 3 was produced in which an insulating layer was formed.

Next, a wiring layer was formed in the same way as in Example 1 except that the laminated body 3 was used. In this way, a heat dissipating substrate was produced.

Example 4

A die coater having a coating width of 150 mm was used to coat the polyimide precursor solution 1 onto an area of 150 mm square of an aluminum base (A5052 H34™, commercially available from MANSEI KOGYO CO.) having a thickness of 1000 μm and cut into a size of 16 cm square in such a manner that after cured, the coated solution 1 would have a thickness of 10 μm. The workpiece was dried in the atmosphere in an oven of 80° C. for 60 minutes. Thereafter, the workpiece was subjected to heat treatment at 350° C. (temperature-raising rate: 10° C./minute) in nitrogen atmosphere for 1 hour (followed by natural cooling). In this way, a laminated body 4 was produced in which an insulating layer was formed.

Next, a wiring layer was formed in the same way as in Example 1 except that the laminated body 4 was used. In this way, a heat dissipating substrate was produced.

Example 5

A die coater having a coating width of 150 mm was used to coat the polyimide precursor solution 1 onto an area of 150 mm square of a copper base (manufactured by Furukawa Electric Co., Ltd.) having a thickness of 150 μm and cut into a size of 16 cm square in such a manner that after cured, the coated solution 1 would have a thickness of 10 μm. The workpiece was dried in the atmosphere in an oven of 80° C. for 60 minutes. Thereafter, a resist was formed onto the polyimide precursor film. Simultaneously with the development thereof, the polyimide precursor film was developed. Thereafter, the resist pattern was peeled and then the workpiece was subjected to heat treatment at 350° C. (temperature-raising rate: 10° C./minute) in nitrogen atmosphere for 1 hour (followed by natural cooling) to yield a laminated body 5 having an insulating-layer-removed section in which the following was removed from the insulating layer: a region having a width of 5 mm and extending from a position of the layer 10 mm apart inwards from the outer circumference of the insulating layer made of the polyimide toward the center thereof.

Next, a wiring layer was formed in the same way as in Example 1 except that the laminated body 5 was used. In this way, a heat dissipating substrate was produced in which an insulating layer was patterned.

Example 6

A die coater having a coating width of 150 mm was used to coat the polyimide precursor solution 10 onto an area of 150 mm square of a copper base (manufactured by Furukawa Electric Co., Ltd.) having a thickness of 150 μm and cut into a size of 16 cm square in such a manner that after cured, the coated solution 10 would have a thickness of 10 μm. The workpiece was dried in the atmosphere in an oven of 80° C. for 60 minutes. Thereafter, the workpiece was subjected to heat treatment at 350° C. (temperature-raising rate: 10° C./minute) in nitrogen atmosphere for 1 hour (followed by natural cooling) to yield a laminated body 10 in which the polyimide film was formed on the whole of one of the surfaces thereof.

Next, a resist pattern was formed on the polyimide film of the laminated body 10. Its polyimide-exposed regions were removed with a polyimide etching solution TPE-3000™ (manufactured by Toray Engineering Co., Ltd.), and then the resist pattern was peeled to yield a laminated body 6 having an insulating-layer-removed section in which the following was removed from the insulating layer: a region having a width of 5 mm and extending from a position of the layer 10 mm apart inwards from the outer circumference of the insulating layer made of the polyimide toward the center thereof.

Next, a wiring layer was formed in the same way as in Example 1 except that the laminated body 6 was used. In this way, a heat dissipating substrate was produced in which an insulating layer was patterned.

Example 7

A die coater having a coating width of 150 mm was used to coat each of the photosensitive polyimide precursor solutions 1 and 2 onto an area of 150 mm square of a copper base (manufactured by Furukawa Electric Co., Ltd.) having a thickness of 150 μm and cut into a size of 16 cm square. The workpiece was dried in the atmosphere in an oven of 80° C. for 60 minutes. The workpiece was exposed through a photomask to light from a high-pressure mercury lamp at 2000 mJ/cm², which was in terms of illuminance of a ray having a wavelength of 365 nm, and then heated on a hot plate at 170° C. for 10 minutes. The workpiece was then developed with a TMAH solution in water, and then subjected to heat treatment at 350° C. (temperature-raising rate: 10° C./minute) in nitrogen atmosphere for 1 hour (followed by natural cooling) to form a polyimide film having a thickness of 3 μm and made of one of a photosensitive polyimide 1 and a photosensitive polyimide 2. In this way, laminated bodies 7-1 and 7-2 were yielded which each had an insulating-layer-removed section in which the following was removed from the insulating layer: a region having a width of 5 mm and extending from a position of the layer 10 mm apart inwards from the outer circumference of the insulating layer made of the polyimide toward the center thereof.

Next, a wiring layer was formed in the same way as in Example 1 except that each of the laminated bodies 7-1 and 7-2 was used. In this way, heat dissipating substrates were produced in each of which the insulating layer was patterned.

Example 8

A die coater having a coating width of 150 mm was used to coat the polyimide precursor solution 1 onto an area of 150 mm square of a copper base (manufactured by Furukawa Electric Co., Ltd.) having a thickness of 35 μm and cut into a size of 16 cm square in such a manner that after cured, the coated solution 1 would have a thickness of 20 μm. The workpiece was dried in the atmosphere in an oven of 80° C. for 60 minutes. Thereafter, the workpiece was subjected to heat treatment at 350° C. (temperature-raising rate: 10° C./minute) in nitrogen atmosphere for 1 hour (followed by natural cooling) to form an insulating layer.

Thereafter, a pattern of a resist for metal-etching was formed on the support base material surface of this laminated base. Specifically, a dry film resist for metal-etching was laminated on each surface of the laminated base. The support base material surface side thereof was patternwise exposed to light, and the insulating layer side thereof was wholly exposed to light. The workpiece was then developed with a sodium carbonate solution in water to form a resist pattern onto the support base material surface. Next, a solution of ferric chloride in water was used as an etching solution to etch the support base material masked with the resist pattern patternwise. In this way, a laminated body 8 was produced.

Next, a wiring layer was formed in the same way as in Example 1 except that the laminated body 8 was used. In this way, a heat dissipating substrate was produced in which the support base material was patterned.

Example 9

A press machine was used to punch out the heat dissipating substrate produced by the method described in Example 1 by aid of a mold, thereby yielding a heat dissipating substrate having a patterned support base material.

[Laminated Body Production Example 1-1]

An aluminum base (A5052 H34™, commercially available from MANSEI KOGYO CO.) having a thickness of 1000 μm and cut into a size of 16 cm square was subjected, for the formation of a power feeding layer, to electroless plating with Ni followed by electroplating with Ni for giving an electroplating thickness of 1 μm. A die coater having a coating width of 150 mm was used to coat the polyimide precursor solution 1 onto an area of 150 mm square of the aluminum plated with Ni in such a manner that after cured, the coated solution 1 would have a thickness of 5 μm. The workpiece was dried in the atmosphere in an oven of 80° C. for 60 minutes. A resist was formed on the polyimide precursor film. Simultaneously with the development thereof, the polyimide precursor film was developed with a TMAH solution in water. Thereafter, an agent ALKASTEP HTO™ was used to peel off the resist pattern, and then subjected to heat treatment at 350° C. (temperature-raising rate: 10° C./minute) in nitrogen atmosphere for 1 hour (followed by natural cooling) to yield a laminated body A1-1 having an insulating-layer-removed section in which the following was removed from the insulating layer: a region having a width of 5 mm and extending from a position of the layer 10 mm apart inwards from the outer circumference of the insulating layer made of the polyimide toward the center thereof.

[Laminated Body Production Example 1-2]

An aluminum base (A5052 H34™, commercially available from MANSEI KOGYO CO.) having a thickness of 1000 μm and cut into a size of 16 cm square was subjected to electroless plating with Ni to give a plating thickness of 1 μm. A die coater having a coating width of 150 mm was used to coat the polyimide precursor solution 1 onto an area of 150 mm square of the aluminum plated with Ni in such a manner that after cured, the coated solution 1 would have a thickness of 5 μm. The workpiece was dried in the atmosphere in an oven of 80° C. for 60 minutes. A resist was then formed on the polyimide precursor film. Simultaneously with the development thereof, the polyimide precursor film was developed with a TMAH solution in water. Thereafter, an agent ALKASTEP HTO™ was used to peel off the resist pattern. At this time, foam was generated from the surface of the aluminum so that the aluminum surface was whitened. This workpiece was subjected to heat treatment at 350° C. (temperature-raising rate: 10° C./minute) in nitrogen atmosphere for 1 hour (followed by natural cooling) to yield a laminated body A1-2 having an insulating-layer-removed section in which the following was removed from the insulating layer: a region having a width of 5 mm and extending from a position of the layer 10 mm apart inwards from the outer circumference of the insulating layer made of the polyimide toward the center thereof.

[Laminated Body Production Example 1-3]

An anodic oxidization alumite sulfate coat of 50 μm thickness was formed on an aluminum base (A5052 H34™, commercially available from MANSEI KOGYO CO.) having a thickness of 1000 μm and cut into a size of 16 cm square. A die coater having a coating width of 150 mm was used to coat the polyimide precursor solution 1 onto an area of 150 mm square of the aluminum, on which the alumite coat was formed, in such a manner that after cured, the coated solution 1 would have a thickness of 5 μm. The workpiece was dried in the atmosphere in an oven of 80° C. for 60 minutes. A resist was then formed on the polyimide precursor film. Simultaneously with the development thereof, the polyimide precursor film was developed with a TMAH solution in water. Thereafter, an agent ALKASTEP HTO™ was used to peel off the resist pattern, and then the workpiece was subjected to heat treatment at 350° C. (temperature-raising rate: 10° C./minute) in nitrogen atmosphere for 1 hour (followed by natural cooling) to yield a laminated body A1-3 having an insulating-layer-removed section in which the following was removed from the insulating layer: a region having a width of 5 mm and extending from a position of the layer 10 mm apart inwards from the outer circumference of the insulating layer made of the polyimide toward the center thereof.

[Reference Laminated Body Production Example 1]

A die coater having a coating width of 150 mm was used to coat the polyimide precursor solution 1 onto an area of 150 mm square of an aluminum base (A5052 H34™, commercially available from MANSEI KOGYO CO.) having a thickness of 1000 μm and cut into a size of 16 cm square in such a manner that after cured, the coated solution 1 would have a thickness of 5 μm. The workpiece was dried in the atmosphere in an oven of 80° C. for 60 minutes. A resist was then formed on the polyimide precursor film. Simultaneously with the development thereof, the polyimide precursor film was developed with a TMAH solution in water. At this time, foam was generated from the surface of the aluminum so that the aluminum surface was whitened.

Thereafter, an agent ALKASTEP HTO™ (manufactured by Nichigo-Morton Co., Ltd.) was used to attempt to peel off the resist pattern. However, foam was vigorously generated from the aluminum surface so that the resist pattern was unable to be peeled off.

[Reference Laminated Body Production Example 2]

An anodic oxidization alumite sulfate coat of 5 thickness was formed on an aluminum base (A5052 H34™, commercially available from MANSEI KOGYO CO.) having a thickness of 1000 μm and cut into a size of 16 cm square. A die coater having a coating width of 150 mm was used to coat the polyimide precursor solution 1 onto an area of 150 mm square of the aluminum, on which the alumite coat was formed, in such a manner that after cured, the coated solution 1 would have a thickness of 5 μm. The workpiece was dried in the atmosphere in an oven of 80° C. for 60 minutes. A resist was then formed on the polyimide precursor film. Simultaneously with the development thereof, the polyimide precursor film was developed with a TMAH solution in water.

Thereafter, an agent ALKASTEP HTO™ (manufactured by Nichigo-Morton Co., Ltd.) was used to attempt to peel off the resist pattern. However, foam was vigorously generated from the aluminum surface so that the resist pattern was unable to be peeled off.

[Laminated Body Production Example 2-1]

Aluminum bases (A5052 H34™, commercially available from MANSEI KOGYO CO.) each having a thickness of 1000 and cut into a size of 16 cm square were each subjected, for the formation of a power feeding layer, to electroless plating with Ni followed by electroplating with Ni for giving an electroplating thickness of 1 μm. A die coater having a coating width of 150 mm was used to coat each of the photosensitive polyimide precursor solutions 1 and 2 onto an area of 150 mm square of one of the aluminum bases plated with Ni. The workpieces were dried in the atmosphere in an oven of 80° C. for 60 minutes. The workpieces were each exposed through a photomask to light from a high-pressure mercury lamp at 2000 mJ/cm², which was in terms of illuminance of a ray having a wavelength of 365 nm, and then heated on a hot plate at 170° C. for 10 minutes. The workpieces were developed with a TMAH solution in water, and then subjected to heat treatment at 350° C. (temperature-raising rate: 10° C./minute) in nitrogen atmosphere for 1 hour (followed by natural cooling) to form polyimide films made of a photosensitive polyimide 1 and a photosensitive polyimide 2, respectively, and each having a thickness of 3 μm. In this way, laminated bodies A2-1 and A2-2 were yielded which each had an insulating-layer-removed section in which the following was removed from the insulating layer: a region having a width of 5 mm and extending from a position of the layer 10 mm apart inwards from the outer circumference of the insulating layer made of the polyimide toward the center thereof.

[Laminated Body Production Example 2-2]

Aluminum bases (A5052 H34™, commercially available from MANSEI KOGYO CO.) each having a thickness of 1000 μm and cut into a size of 16 cm square were each subjected to electroless plating with Ni to give a plating thickness of 1 μm. A die coater having a coating width of 150 mm was used to coat each of the photosensitive polyimide precursor solutions 1 and 2 onto an area of 150 mm square of one of the aluminum bases plated with Ni. The workpieces were dried in the atmosphere in an oven of 80° C. for 60 minutes. The workpieces were each exposed through a photomask to light from a high-pressure mercury lamp at 2000 mJ/cm², which was in terms of illuminance of a ray having a wavelength of 365 nm, and then heated on a hot plate at 170° C. for 10 minutes. The workpieces were then developed with a TMAH solution in water, and then subjected to heat treatment at 350° C. (temperature-raising rate: 10° C./minute) in nitrogen atmosphere for 1 hour (followed by natural cooling) to form polyimide films made of a photosensitive polyimide 1 and a photosensitive polyimide 2, respectively, and each having a thickness of 3 μm. In this way, laminated bodies A2-3 and A2-4 were yielded which each had an insulating-layer-removed section in which the following was removed from the insulating layer: a region having a width of 5 mm and extending from a position of the layer 10 mm apart inwards from the outer circumference of the insulating layer made of the polyimide toward the center thereof.

[Reference Laminated Body Production Example 3]

A die coater having a coating width of 150 mm was used to coat each of the photosensitive polyimide precursor solutions 1 and 2 onto an area of 150 mm square of an aluminum base (A5052 H34™, commercially available from MANSEI KOGYO CO.) having a thickness of 1000 μm and cut into a size of 16 cm square. The workpieces were dried in the atmosphere in an oven of 80° C. for 60 minutes. The workpieces were each exposed through a photomask to light from a high-pressure mercury lamp at 2000 mJ/cm², which was in terms of illuminance of a ray having a wavelength of 365 nm, and then heated on a hot plate at 170° C. for 10 minutes. The workpiece was then developed with a TMAH solution in water. At this time, foam was generated from the aluminum surface so that the aluminum surface was whitened.

[Laminated Body Production Example 3]

An aluminum base (A5052 H34™, commercially available from MANSEI KOGYO CO.) having a thickness of 1000 μm and cut into a size of 16 cm square was subjected, for the formation of a power feeding layer, to electroless plating with Ni followed by electroplating with Ni for giving an electroplating thickness of 1 μm. A die coater having a coating width of 150 mm was used to coat the photosensitive polyimide precursor solution 12 onto an area of 150 mm square of the aluminum base plated with Ni in such a manner that after cured, the coated solution 12 would have a thickness of 5 μm. The workpiece was dried in the atmosphere in an oven of 80° C. for 60 minutes, and then subjected to heat treatment at 350° C. (temperature-raising rate: 10° C./minute) in nitrogen atmosphere for 1 hour (followed by natural cooling).

Thereafter, a resist pattern was formed on the insulating layer made of the polyimide in the laminated body. Its insulating-layer-exposed regions were removed with a polyimide etching solution TPE-3000™ (manufactured by Toray Engineering Co., Ltd.) to yield a laminated body A3 having an insulating-layer-removed section in which the following was removed from the insulating layer: a region having a width of 5 mm and extending from a position of the layer 10 mm apart inwards from the outer circumference of the insulating layer made of the polyimide toward the center thereof.

[Reference Laminated Body Production Example 4-1]

An aluminum base (A5052 H34™, commercially available from MANSEI KOGYO CO.) having a thickness of 1000 μm and cut into a size of 16 cm square was subjected to electroless plating with Ni to give a plating thickness of 1 μm. A die coater having a coating width of 150 mm was used to coat the photosensitive polyimide precursor solution 12 onto an area of 150 mm square of the aluminum plated with Ni in such a manner that after cured, the coated solution 12 would have a thickness of 5 μm. The workpiece was dried in the atmosphere in an oven of 80° C. for 60 minutes. Thereafter, the workpiece was subjected to heat treatment at 350° C. (temperature-raising rate: 10° C./minute) in nitrogen atmosphere for 1 hour (followed by natural cooling).

Thereafter, a resist pattern was formed on the insulating layer made of the polyimide in the laminated body. Its insulating-layer-exposed regions were removed with a polyimide etching solution TPE-3000™ (manufactured by Toray Engineering Co., Ltd.). At this time, foam was vigorously generated from the aluminum surface so that no insulating-layer-removed section was able to be formed.

[Reference Laminated Body Production Example 4-2]

A die coater having a coating width of 150 mm was used to coat the photosensitive polyimide precursor solution 12 onto an area of 150 mm square of an aluminum base (A5052 H34™, commercially available from MANSEI KOGYO CO.) having a thickness of 1000 μm and cut into a size of 16 cm square in such a manner that after cured, the coated solution 12 would have a thickness of 5 μm. The workpiece was dried in the atmosphere in an oven of 80° C. for 60 minutes. Thereafter, the workpiece was subjected to heat treatment at 350° C. (temperature-raising rate: 10° C./minute) in nitrogen atmosphere for 1 hour (followed by natural cooling).

Thereafter, a resist pattern was formed on the insulating layer made of the polyimide in the laminated body. Its insulating-layer-exposed regions were removed with a polyimide etching solution TPE-3000™ (manufactured by Toray Engineering Co., Ltd.). At this time, foam was vigorously generated from the aluminum surface so that no insulating-layer-removed section was able to be formed.

Example 10

An aluminum base (A5052 H34™, commercially available from MANSEI KOGYO CO.) having a thickness of 1000 μm and cut into a size of 16 cm square was subjected, for the formation of a power feeding layer, to electroless plating with Ni followed by electroplating with Ni for giving an electroplating thickness of 1 μm. A die coater having a coating width of 150 mm was used to coat the polyimide precursor solution 1 onto an area of 150 mm square of an aluminum base (A5052 H34™, commercially available from MANSEI KOGYO CO.) having a thickness of 1000 μm and cut into a size of 16 cm square on the aluminum plated with Ni in such a manner that after cured, the coated solution 1 would have a thickness of 5 μm. The workpiece was dried in the atmosphere in an oven of 80° C. for 60 minutes. Thereafter, the workpiece was subjected to heat treatment at 350° C. (temperature-raising rate: 10° C./minute) in nitrogen atmosphere for 1 hour (followed by natural cooling) to yield a laminated body A4 in which an insulating layer was formed.

Next, a wiring layer was formed on the insulating layer of the laminated body A4 as follows.

First, the whole of the insulating-layer-formed side of the laminated body was subjected to chromium sputtering followed by copper sputtering to form an underlaid layer for plating that had a thickness of 0.3 μm.

Next, a dry film resist was used to form a resist layer having openings matched with a wiring layer shape, and then the above-mentioned copper electroplating solution was used to conduct copper electroplating, thereby laying a wiring layer which was a copper electroplating layer of 10 μm thickness.

Next, an agent ALKASTEP HTO™ (manufactured by Nichigo-Morton Co., Ltd.) was used to peel the resist pattern, or the resist layer, and then the copper layer was subjected to flash etching with an agent CA5330H™ manufactured by Mecc Co., Ltd. An agent WCR-4015™ (manufactured by Adeka Corp.) having a strong alkalinity (pH>13) was used to subject the Cr layer to flash etching. In this way, a wiring layer was formed to produce a heat dissipating substrate.

Example 11

An aluminum base (A5052 H34™, commercially available from MANSEI KOGYO CO.) having a thickness of 1000 μm and cut into a size of 16 cm square was subjected to electroless plating with Ni to give a plating thickness of 1 μm. A die coater having a coating width of 150 mm was used to coat the polyimide precursor solution 1 onto an area of 150 mm square of an aluminum base (A5052 H34™, commercially available from MANSEI KOGYO CO.) having a thickness of 1000 μm and cut into a size of 16 cm square on the aluminum plated with Ni in such a manner that after cured, the coated solution 1 would have a thickness of 5 μm. The workpiece was dried in the atmosphere in an oven of 80° C. for 60 minutes. Thereafter, the workpiece was subjected to heat treatment at 350° C. (temperature-raising rate: 10° C./minute) in nitrogen atmosphere for 1 hour (followed by natural cooling) to yield a laminated body A5 in which an insulating layer was formed.

Next, a wiring layer was formed on the insulating layer of the laminated body A5 as follows.

First, the whole of the insulating-layer-formed side of the laminated body was subjected to chromium sputtering followed by copper sputtering to form an underlaid layer for plating that had a thickness of 0.3 μm.

Next, a dry film resist was used to form a resist layer having openings matched with a wiring layer shape, and then the above-mentioned copper electroplating solution was used to conduct copper electroplating, thereby laying a wiring layer which was a copper electroplating layer of 10 μm thickness.

Next, an agent ALKASTEP HTO™ (manufactured by Nichigo-Morton Co., Ltd.) was used to peel the resist pattern, or the resist layer, and then the copper layer was subjected to flash etching with an agent CA5330H™ manufactured by Mecc Co., Ltd. An agent WCR-4015™ (manufactured by Adeka Corp.) having a strong alkalinity (pH>13) was used to subject the Cr layer to flash etching. In this way, a wiring layer was formed to produce a heat dissipating substrate.

[Reference Laminated Body Production Example 4]

A die coater having a coating width of 150 mm was used to coat the photosensitive polyimide precursor solution 1 onto an area of 150 mm square of an aluminum base (A5052 H34™, commercially available from MANSEI KOGYO CO.) having a thickness of 1000 μm and out into a size of 16 cm square in such a manner that after cured, the coated solution 1 would have a thickness of 5 μm. The workpiece was dried in the atmosphere in an oven of 80° C. for 60 minutes. Thereafter, the workpiece was subjected to heat treatment at 350° C. (temperature-raising rate: 10° C./minute) in nitrogen atmosphere for 1 hour (followed by natural cooling) to form a laminated body A6 in which an insulating layer was formed.

Next, a wiring layer was formed on the insulating layer of the laminated body A6 as follows.

First, the whole of the insulating-layer-formed side of the laminated body 6 was subjected to chromium sputtering followed by copper sputtering to form an underlaid layer for plating that had a thickness of 0.3 μm.

Next, a dry film resist was used to form a resist layer having openings matched with a wiring layer shape, and then the above-mentioned copper electroplating solution was used to conduct copper electroplating, thereby laying a wiring layer which was a copper electroplating layer of 10 μm thickness.

Next, an agent ALKASTEP HTO™ (manufactured by Nichigo-Morton Co., Ltd.) was used to peel the resist pattern, or the resist layer. At this time, foam was generated from the aluminum surface so that the aluminum surface was whitened.

The copper layer was subjected to flash etching with an agent CA5330H™ manufactured by Mecc Co., Ltd., and then an agent WCR-4015™ (manufactured by Adeka Corp.) having a strong alkalinity (pH>13) was used to subject the Cr layer to flash etching. At this time, foam was vigorously generated from the aluminum surface, so that the Cr layer was unable to be completely removed.

[Reference Laminated Body Production Example 5]

A die coater having a coating width of 150 mm was used to coat the photosensitive polyimide precursor solution 12 onto an area of 150 mm square of an aluminum base (A5052 H34™, commercially available from MANSEI KOGYO CO.) having a thickness of 1000 µm and cut into a size of 16 cm square in such a manner that after cured, the coated solution 12 would have a thickness of 5 µm. The workpiece was dried in the atmosphere in an oven of 80° C. for 60 minutes. Thereafter, the workpiece was subjected to heat treatment at 350° C. (temperature-raising rate: 10° C./minute) in nitrogen atmosphere for 1 hour (followed by natural cooling).

Thereafter, a resist pattern was formed onto the insulating layer made of the polyimide in the laminated body. Its insulating-layer-exposed regions were removed with a polyimide etching solution TPE-3000™ (manufactured by Toray Engineering Co., Ltd.). At this time, foam was vigorously generated from the aluminum surface so that no insulating-layer-removed section was able to be formed.

Example 12

A wiring layer was formed on the insulating layer of the laminated body A1-1 as follows.

First, the whole of the insulating-layer-formed side of the laminated body was subjected to surface-roughening treatment under conditions described below, and washed with water. Furthermore, a catalyst was given thereto, and electroless plating was applied thereto under conditions described below to form an electroless plating layer having a thickness of 0.3 µm.

<Surface-roughening Treatment Conditions>
  Wet blast machine, manufactured by Macoho Co., Ltd.
  Alumina grinding stones; water pressure: 0.7 kg/m$^2$
  Treatment speed: 10 m/min
<Electroless Plating Conditions>
  Sensitizing: 3 minutes according to S-10X™ (manufactured by C. Uyemura & Co., Ltd.)
  Activating: 3 minutes according to A-10X™ (manufactured by C. Uyemura & Co., Ltd.)
  Electroless plating: 1 minute according to NPR-4™ (manufactured by C. Uyemura & Co., Ltd.)

Next, a dry film resist (AQ 5038™, manufactured by Asahi Kasei Corporation.) was used, and the workpiece was coated with this resist to become 50 µm in thickness, exposed to light, and developed to form a resist layer having openings matched with a wiring layer shape.

<Treatment Conditions>
  Prebake: 5 minutes at 120° C.
  Exposure: 60 mJ/cm$^2$
  Development: 1 minute with a 1% sodium carbonate solution (30° C.)

Next, the upper of the electroless plating layer exposed from the openings in the resist layer was successively subjected to nickel bright electroplating, copper electroplating, dull electroplating, and gold electroplating to lay a wiring layer including an electroplating layer in which a nickel bright electroplating layer, a copper electroplating layer, a dull electroplating layer, and a gold electroplating layer were formed to have thicknesses of 0.2 µm, 10 µm, 0.2 µm and 0.1 µm, respectively.

<Solution Composition and Conditions of Nickel Bright Electroplating>
  Nickel sulfate (hexahydrate): 300 g/L
  Nickel chloride (hexahydrate): 45 g/L
  Boric acid: 40 g/L
  PC nickel A-1: 10 mL/L (manufactured by C. Uyemura & Co., Ltd.)
  PC nickel A-2: 1 mL/L (manufactured by C. Uyemura & Co., Ltd.)
  Temperature: 50° C.
  Current density: 1 A/dm$^2$
  Period: 1 minute
  Copper sulfate plating: formed into a thickness of 10 µm <Solution Composition and Conditions of Copper Electroplating>
  Copper sulfate (pentahydrate): 70 g/L
  Sulfuric acid: 200 g/L
  Hydrochloric acid: 0.5 mL/L
  Brightener: SUPER SLOW 2000™, 10 mL/L
  Correcting agent: SUPPER SLOW 2000™, 5 mL/L
  Temperature: 30° C.
  Current density: 4 A/dm$^2$
  Period: 12 minutes <Ni Dull Electroplating>
  WHN plating solution (manufactured by Japan Pure Chemical Co., Ltd.)
  Temperature: 50° C.
  Current density: 1 A/dm$^2$
  Period: 1 minute <Gold Electroplating>
  TEMPERESIST K-91™ (manufactured by Japan Pure Chemical Co., Ltd.)
  Temperature: 60° C.
  Current density: 0.4 A/dm$^2$
  Period: 1.25 minutes Next, the resist layer was peeled and removed with a 3% solution of sodium hydroxide at 50° C. for 1 minute, and washed. The electroless plating layer 140 made exposed was softly etched with a solution NIMUDEN RIP C-11™ to be peeled off.

Furthermore, in order to remove the catalyst, a wet blasting machine manufactured by Macoho Co., Ltd. was used to treat the workpiece with alumina grinding stones at a water pressure of 0.5 kg/m$^2$ and a treating rate of 10 m/min to remove the catalyst. Next, the workpiece was subjected to heat treatment at 180° C. in nitrogen atmosphere for 1 hour to form a wiring layer. In this way, a heat dissipating substrate 1-1 was produced.

Example 13

Heat dissipating substrates 1-2, 1-3, 2-1, 2-2, 2-3, 2-4, 2-5, 2-6 and 3 were produced in the same way except that instead of the laminated body A-1, the following were used, respectively: laminated bodies A1-2, A1-3, A2-1, A2-2, A2-3, A2-4, A2-5, A2-6, and A3.

Example 14

A wiring layer was formed on the insulating layer of the laminated body A1-1 as follows.

First, the whole of the insulating-layer-formed side of the laminated body A1-1 was subjected to chromium sputtering followed by copper sputtering to form an underlaid layer for plating that had a thickness of 0.3 µm.

Next, a dry film resist was used to form a resist layer having openings matched with a wiring layer shape, and then the above-mentioned copper electroplating solution was used to conduct copper electroplating, thereby laying a wiring layer which was a copper electroplating layer of 10 µm thickness.

Next, an agent ALKASTEP HTO™ (manufactured by Nichigo-Morton Co., Ltd.) was used to peel the resist pattern, or the resist layer, and then the copper layer was subjected to flash etching with an agent CA5330H™ manufactured by Mecc Co., Ltd. An agent WCR-4015™ (manufactured by Adeka Corp.) having a strong alkalinity (pH>13) was used to subject the Cr layer to flash etching. In this way, a wiring layer was formed to produce a heat dissipating substrate C1-1.

Example 15

Heat dissipating substrates C1-2, C2-1, C2-2, C2-3, C2-4, and C3 were produced in the same way except that instead of the laminated body A-1, the following were used, respectively: laminated bodies A1-2, A2-1, A2-2, A2-3, A2-4, and A3.

[Reference Heat Dissipating Substrate Production Example 6]

A die coater having a coating width of 150 mm was used to coat the polyimide precursor solution 1 onto an area of 150 mm square of an aluminum base (A5052 H34™, commercially available from MANSEI KOGYO CO.) having a thickness of 1000 µm and cut into a size of 16 cm square in such a manner that after cured, the coated solution 1 would have a thickness of 5 µm. The workpiece was dried in the atmosphere in an oven of 80° C. for 60 minutes. Thereafter, the workpiece was subjected to heat treatment at 350° C. (temperature-raising rate: 10° C./minute) in nitrogen atmosphere for 1 hour (followed by natural cooling) to form a laminated body A7 in which an insulating layer was formed.

Next, a wiring layer was formed on the insulating layer of the laminated body A7 as follows.

First, the whole of the insulating-layer-formed side of the laminated body A7 was subjected to chromium sputtering followed by copper sputtering to form an underlaid layer for plating that had a thickness of 0.3 µm.

Next, a dry film resist was used to form a resist layer having openings matched with a wiring layer shape, and then the above-mentioned copper electroplating solution was used to conduct copper electroplating, thereby laying a wiring layer which was a copper electroplating layer of 10 µm thickness.

Next, an agent ALKASTEP HTO™ (manufactured by Nichigo-Morton Co., Ltd.) was used to peel the resist pattern, or the resist layer. At this time, foam was generated from the aluminum surface so that the aluminum surface was whitened.

The copper layer was subjected to flash etching with an agent CA5330H™ manufactured by Mecc Co., Ltd., and then an agent WCR-4015™ (manufactured by Adeka Corp.) having a strong alkalinity (pH>13) was used to subject the Cr layer to flash etching. At this time, foam was vigorously generated from the aluminum surface, so that the Cr layer was unable to be completely removed.

Example 16

Prepared was a heat dissipating substrate C-1 in which a copper piece as an anode was patterned in a 2-mm-width-line form. α-NPD (N,N'-di[(1-naphthyl)-N,N'-diphenyl]-1,1'-biphenyl)-4,4'-diamine and $MoO_3$ were formed on the heat dissipating substrate at a ratio by volume of 4:1 into a film having a film thickness of 40 nm by vapor co-deposition at a vacuum degree of $10^{-5}$ Pa and a vapor deposition rate of 1.0 Å/sec. In this way, a hole injecting layer was formed. Next, α-NPD was formed into a hole transporting layer having a film thickness of 20 nm by a vacuum deposition method at a vacuum degree of $10^{-5}$ Pa and a vapor deposition rate of 1.0 Å/sec. Next, $Alq_3$ (tris-(8-hydroxyquinoline)aluminum) was used as a host material and C545t was used as a green light emitting dopant to form a film having a film thickness of 35 nm and having a C545t concentration of 3% by weight on the hole transporting layer by vacuum deposition at a vacuum degree of $10^{-5}$ Pa and a vapor deposition rate of 1.0 Å/sec. In this way, a light emitting layer was formed. Next, $Alq_3$ was formed into an electron transporting layer having a film thickness of 10 nm by vacuum deposition at a vacuum degree of $10^{-5}$ Pa and a vapor deposition rate of 1.0 Å/sec. Next, $Alq_3$ and LiF were formed into a film having a film thickness of 15 nm by vapor co-deposition at a vacuum degree of $10^{-5}$ Pa and a vapor deposition rate of 1.0 Å/sec. In this way, an electron injecting layer was formed. Finally, IZO was sputtered into a film having a film thickness of 200 nm. In this way, a cathode was formed.

After the formation of the cathode, the element was transported from the vacuum deposition machine to a glove box having nitrogen atmosphere in which the water concentration was 0.1 ppm or less, and then a barrier film was used to seal the EL, thereby forming an EL element on the heat dissipating substrate.

Reference Example 1

The polyimide precursor solution 1 was applied onto a copper base (C1100P™, commercially available from MANSEI KOGYO CO.) having a thickness of 1000 µm and cut into a size of 5 cm square by spin coating. The workpiece was dried on a hot plate of 100° C. for 15 minutes, and then subjected to heat treatment at 350° C. for 1 hour in nitrogen atmosphere to form a base-1 for temperature-rise-restraint-evaluation in which a polyimide layer having a film thickness of 7.7 µm was formed on the copper base.

Reference Example 2

The polyimide precursor solution 1 was applied onto an aluminum base (A5052 H34™, commercially available from MANSEI KOGYO CO.) having a thickness of 1000 µm and cut into a size of 5 cm square by spin coating. The workpiece was dried on a hot plate of 100° C. for 15 minutes, and then subjected to heat treatment at 350° C. for 1 hour in nitrogen atmosphere to form a base-2 for temperature-rise-restraint-evaluation in which a polyimide layer having a film thickness of 7.7 µm was formed on the aluminum base.

Reference Example 3

The polyimide precursor solution 1 was applied onto a copper base (manufactured by Furukawa Electric Co., Ltd.) having a thickness of 150 µm and cut into a size of 5 cm square by spin coating. The workpiece was dried on a hot plate of 100° C. for 15 minutes, and then subjected to heat treatment at 350° C. for 1 hour in nitrogen atmosphere to form a base-3 for temperature-rise-restraint-evaluation in which a polyimide layer having a film thickness of 7.7 µm was formed on the copper base.

[Temperature Rise Restraint Evaluation]

A thermocouple was fixed onto the center of the front surface of a micro ceramic heater MS-M5™ (manufactured by Sakaguchi EH Voc Corp.) of 5 mm square through an agent KER-3000-M2™ (manufactured by Shin-Etsu Chemical Co., Ltd.).

Figure 4:
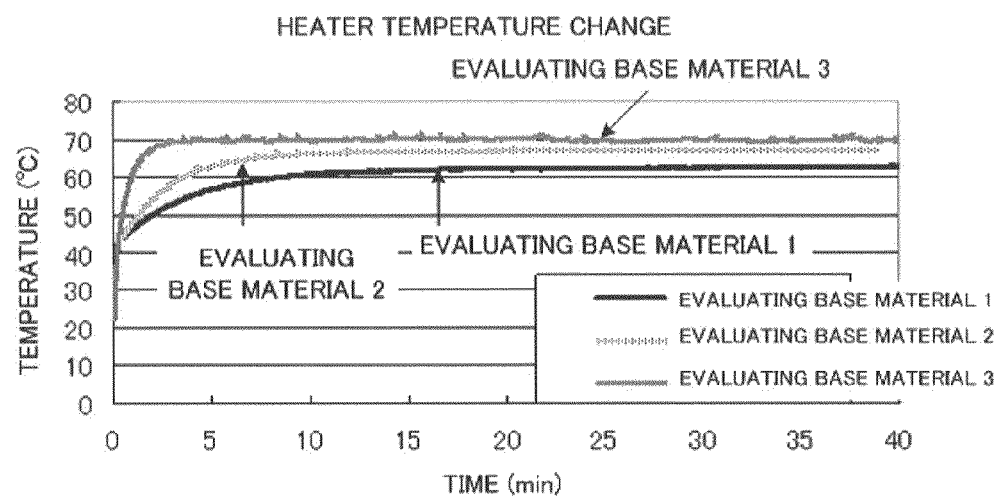
FIG. 4 is a graph showing evaluation results of temperature-rise-restraint evaluating base materials 1 to 3.

A double-sided adhesive tape TC-20SAS (manufactured by Shin-Etsu Chemical Co., Ltd.) cut into a size of 6 mm square was used to fix the micro ceramic heater onto the center of the insulating layer (polyimide layer) of each of the bases for temperature-rise-restraint-evaluation (evaluating bases 1 to 3) produced in Reference Examples 1 to 3, respectively, in such a manner that the insulating layer was brought into contact with the micro ceramic heater surface reverse to the thermocouple-fixed surface. A DC regulated power supply E3643A™ (manufactured by Agilent Technologies, Inc.) was used to supply a current of 0.23 A into the micro ceramic heater, and the surface temperature of the micro ceramic heater was measured through the thermocouple. The results are shown in FIG. 4. Incidentally, in FIG. 4, its transverse axis represents the lapse time from the start of the supply of the current, and its vertical axis a change in the surface temperature of the micro ceramic heater.

Example 17

A heat dissipating substrate was produced in the same way as in Example 1 except that a copper base (C1100P™, commercially available from MANSEI KOGYO CO.) having a thickness of 1000 μm was used instead of the copper base (manufactured by Furukawa Electric Co., Ltd.), which had the thickness of 150 μm and cut into the size of 16 cm square.

REFERENCE SIGNS LIST

1: support base material
2: insulating layer
3: wiring layer
10: heat dissipating substrate
20: element
21: electronic element
22: rear electrode layer
23: EL layer
24: transparent electrode layer
25: transparent substrate

What is claimed is:

1. A heat dissipating substrate, comprising:
   a support base material having a thickness of 70 μm or more, the support base material being a metal or a semiconductor material;
   an insulating layer formed directly on the support base material; and
   a wiring layer formed directly on the insulating layer, wherein the insulating layer is formed by a non-thermoplastic polyimide resin, and has a thickness in the range of 1 μm to 20 μm and the support base material has a thickness of 70 μm or more.

2. The heat dissipating substrate according to claim 1, wherein the insulating layer is substantially a single layer.

3. The heat dissipating substrate according to claim 1, wherein the insulating layer has a coefficient of linear thermal expansion in the range of 0 ppm/° C. to 40 ppm/° C.

4. The heat dissipating substrate according to claim 1, wherein a difference between a coefficient of linear thermal expansion of the insulating layer and a coefficient of linear thermal expansion of the support base material is 15 ppm/° C. or less.

5. The heat dissipating substrate according to claim 1, wherein the insulating layer has a coefficient of hygroscopic expansion in the range of 0 ppm/% RH to 15 ppm/% RH.

6. The heat dissipating substrate according to claim 1, wherein the non-thermoplastic polyimide resin has a volume resistivity of $1.0 \times 10^{12}$ Ω·m or more.

7. The heat dissipating substrate according to claim 1, wherein the support base material is a base material including a metal base material comprising aluminum or an alloy made mainly of aluminum, and a support base material-protective layer formed on the metal base material, and the insulating layer is patterned.

8. The heat dissipating substrate according to claim 1, wherein the support base material, the insulating layer, and the wiring layer are each independently patterned.

9. An element, comprising:
   the heat dissipating substrate according to claim 1; and
   an electronic element arranged on the wiring layer of the heat dissipating substrate.

* * * * *